(12) United States Patent
Chen et al.

(10) Patent No.: US 12,113,005 B2
(45) Date of Patent: Oct. 8, 2024

(54) PACKAGES WITH SI-SUBSTRATE-FREE INTERPOSER AND METHOD FORMING SAME

(71) Applicant: Taiwan Semiconductor Manufacturing Co., Ltd., Hsinchu (TW)

(72) Inventors: Ming-Fa Chen, Taichung (TW); Chen-Hua Yu, Hsinchu (TW)

(73) Assignee: TAIWAN SEMICONDUCTOR MANUFACTURING COMPANY, LTD.

( * ) Notice: Subject to any disclaimer, the term of this patent is extended or adjusted under 35 U.S.C. 154(b) by 0 days.

(21) Appl. No.: 18/186,525

(22) Filed: Mar. 20, 2023

(65) Prior Publication Data
US 2023/0230909 A1    Jul. 20, 2023

Related U.S. Application Data

(63) Continuation of application No. 17/106,744, filed on Nov. 30, 2020, now Pat. No. 11,610,858, which is a
(Continued)

(51) Int. Cl.
*H01L 23/498* (2006.01)
*H01L 21/768* (2006.01)
(Continued)

(52) U.S. Cl.
CPC .. *H01L 23/49822* (2013.01); *H01L 21/76805* (2013.01); *H01L 21/76807* (2013.01);
(Continued)

(58) Field of Classification Search
None
See application file for complete search history.

(56) References Cited

U.S. PATENT DOCUMENTS

| 7,421,777 | B2 | 9/2008 | Asami et al. |
| 7,514,797 | B2 | 4/2009 | Chen et al. |

(Continued)

FOREIGN PATENT DOCUMENTS

| CN | 101315924 A | 12/2008 |
| CN | 102169841 A | 8/2011 |

(Continued)

OTHER PUBLICATIONS

Lu, Jian-Qiang, "3-D Hyperintegration and Packaging Technologies for Micro-Nano Systems," Proceedings of the IEEE, vol. 97, No. 1, Jan. 2009, 14 pages.

*Primary Examiner* — Michelle Mandala
*Assistant Examiner* — Jordan M Klein
(74) *Attorney, Agent, or Firm* — Slater Matsil, LLP

(57) ABSTRACT

A method includes forming a plurality of dielectric layers, forming a plurality of redistribution lines in the plurality of dielectric layers, etching the plurality of dielectric layers to form an opening, filling the opening to form a through-dielectric via penetrating through the plurality of dielectric layers, forming an insulation layer over the through-dielectric via and the plurality of dielectric layers, forming a plurality of bond pads in the dielectric layer, and bonding a device to the insulation layer and a portion of the plurality of bond pads through hybrid bonding.

20 Claims, 26 Drawing Sheets

Related U.S. Application Data continuation of application No. 15/647,704, filed on Jul. 12, 2017, now Pat. No. 10,854,568.

(60) Provisional application No. 62/483,256, filed on Apr. 7, 2017.

(51) Int. Cl.
    *H01L 23/00* (2006.01)
    *H01L 23/48* (2006.01)
    *H01L 25/065* (2023.01)

(52) U.S. Cl.
    CPC .. *H01L 21/76877* (2013.01); *H01L 21/76898* (2013.01); *H01L 23/481* (2013.01); *H01L 24/05* (2013.01); *H01L 24/80* (2013.01); *H01L 25/0657* (2013.01); *H01L 2224/05569* (2013.01); *H01L 2224/05571* (2013.01); *H01L 2224/80895* (2013.01); *H01L 2225/06544* (2013.01); *H01L 2924/0695* (2013.01)

(56) References Cited

U.S. PATENT DOCUMENTS

| | | | |
|---|---|---|---|
| 7,825,024 | B2 | 11/2010 | Lin et al. |
| 8,008,130 | B2 | 8/2011 | Honda |
| 8,361,842 | B2 | 1/2013 | Yu et al. |
| 8,552,563 | B2 | 10/2013 | Law et al. |
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 8,946,884 | B2 | 2/2015 | Kwon et al. |
| 9,182,017 | B2 | 11/2015 | Yoshida et al. |
| 9,425,150 | B2 | 8/2016 | Huang et al. |
| 9,520,333 | B1 | 12/2016 | Shih et al. |
| 9,524,959 | B1 | 12/2016 | Yeh et al. |
| 9,576,821 | B2 | 2/2017 | Lo et al. |
| 9,583,460 | B2 | 2/2017 | Ray et al. |
| 9,653,433 | B2 | 5/2017 | Yu et al. |
| 9,666,520 | B2 | 5/2017 | Yu et al. |
| 9,728,453 | B2 | 8/2017 | Tseng et al. |
| 9,768,144 | B2 | 9/2017 | Wu et al. |
| 10,109,613 | B2 | 10/2018 | Lin et al. |
| 10,269,768 | B2 | 4/2019 | Ho et al. |
| 10,319,699 | B2 | 6/2019 | Wei et al. |
| 11,610,858 | B2 * | 3/2023 | Chen .............. H01L 24/09 |
| 2006/0180938 | A1 | 8/2006 | Kurihara et al. |
| 2007/0006435 | A1 | 1/2007 | Banerji et al. |
| 2009/0134500 | A1 | 5/2009 | Kuo et al. |
| 2010/0123241 | A1 | 5/2010 | Shi et al. |
| 2010/0140805 | A1 | 6/2010 | Chang et al. |
| 2010/0171203 | A1 | 7/2010 | Chen et al. |
| 2010/0187671 | A1 * | 7/2010 | Lin .................. H01L 21/76898 257/773 |
| 2011/0068468 | A1 | 3/2011 | Lin et al. |
| 2011/0248396 | A1 | 10/2011 | Liu et al. |
| 2011/0291288 | A1 | 12/2011 | Wu et al. |
| 2012/0112322 | A1 | 5/2012 | Lin et al. |
| 2012/0190152 | A1 | 7/2012 | Chen et al. |
| 2013/0026468 | A1 | 1/2013 | Yoshimuta et al. |
| 2013/0037935 | A1 | 2/2013 | Xue et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0277852 | A1 | 10/2013 | Chen |
| 2013/0292849 | A1 | 11/2013 | Lin et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0262475 | A1 | 9/2014 | Liu et al. |
| 2014/0263586 | A1 | 9/2014 | Huang et al. |
| 2014/0264930 | A1 | 9/2014 | Yu et al. |
| 2014/0264948 | A1 | 9/2014 | Chou et al. |
| 2014/0375408 | A1 | 12/2014 | Yen et al. |
| 2015/0048503 | A1 | 2/2015 | Chiu et al. |
| 2015/0108644 | A1 | 4/2015 | Kuang et al. |
| 2015/0171006 | A1 | 6/2015 | Hung et al. |
| 2015/0270247 | A1 | 9/2015 | Chen et al. |
| 2015/0318246 | A1 | 11/2015 | Yu et al. |
| 2015/0318263 | A1 | 11/2015 | Yu et al. |
| 2015/0318267 | A1 | 11/2015 | Yu et al. |
| 2015/0340305 | A1 | 11/2015 | Lo |
| 2015/0371951 | A1 | 12/2015 | Yeh et al. |
| 2016/0012172 | A1 | 1/2016 | Folberth et al. |
| 2016/0013133 | A1 | 1/2016 | Gu et al. |
| 2016/0181215 | A1 | 6/2016 | Sullivan et al. |
| 2016/0240465 | A1 | 8/2016 | Chen |
| 2016/0372395 | A1 | 12/2016 | Shih et al. |
| 2017/0025349 | A1 | 1/2017 | Wood |
| 2017/0032977 | A1 | 2/2017 | Chen et al. |
| 2017/0084591 | A1 | 3/2017 | Magnus |
| 2017/0117200 | A1 | 4/2017 | Kim et al. |
| 2017/0164458 | A1 | 6/2017 | Vrtis et al. |
| 2017/0170155 | A1 | 6/2017 | Yu et al. |
| 2017/0186728 | A1 | 6/2017 | Chainer |
| 2017/0207197 | A1 | 7/2017 | Yu et al. |
| 2017/0330767 | A1 | 11/2017 | Kang et al. |
| 2018/0006006 | A1 | 1/2018 | Kim et al. |
| 2019/0363063 | A1 * | 11/2019 | May .............. H01L 23/522 |

FOREIGN PATENT DOCUMENTS

| | | |
|---|---|---|
| CN | 103515305 A | 1/2014 |
| CN | 103579204 A | 2/2014 |
| CN | 104377192 A | 2/2015 |
| CN | 105321903 A | 2/2016 |
| CN | 106257658 A | 12/2016 |
| CN | 106328608 A | 1/2017 |
| DE | 102016100523 A1 | 5/2017 |
| JP | 2001177010 A | 6/2001 |
| JP | 2003298232 A | 10/2003 |
| KR | 20150125582 A | 11/2015 |
| KR | 20160122769 A | 10/2016 |
| TW | 201436069 A | 9/2014 |
| TW | 201501242 A | 1/2015 |
| TW | M531651 U | 11/2016 |
| TW | 201705362 A | 2/2017 |
| WO | 2015171288 A1 | 11/2015 |

* cited by examiner

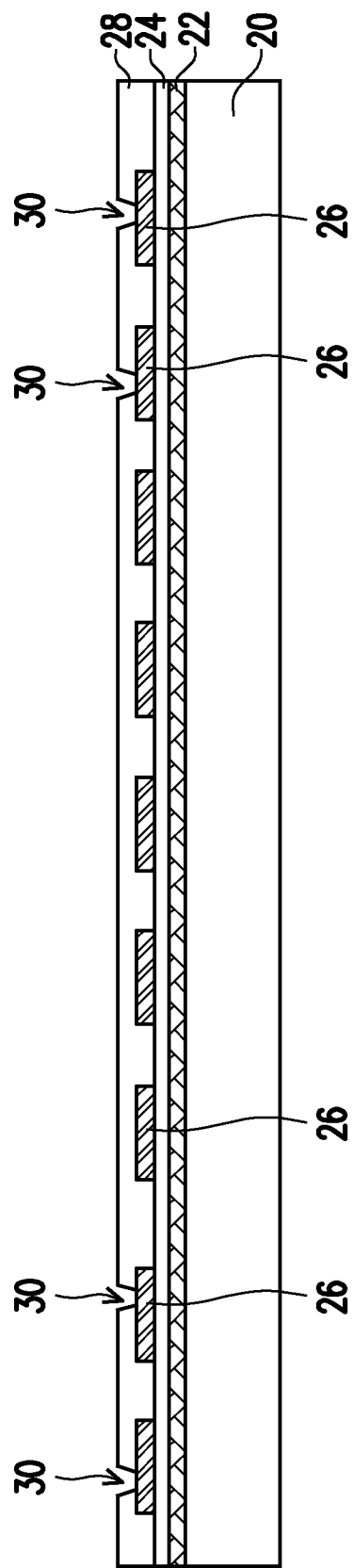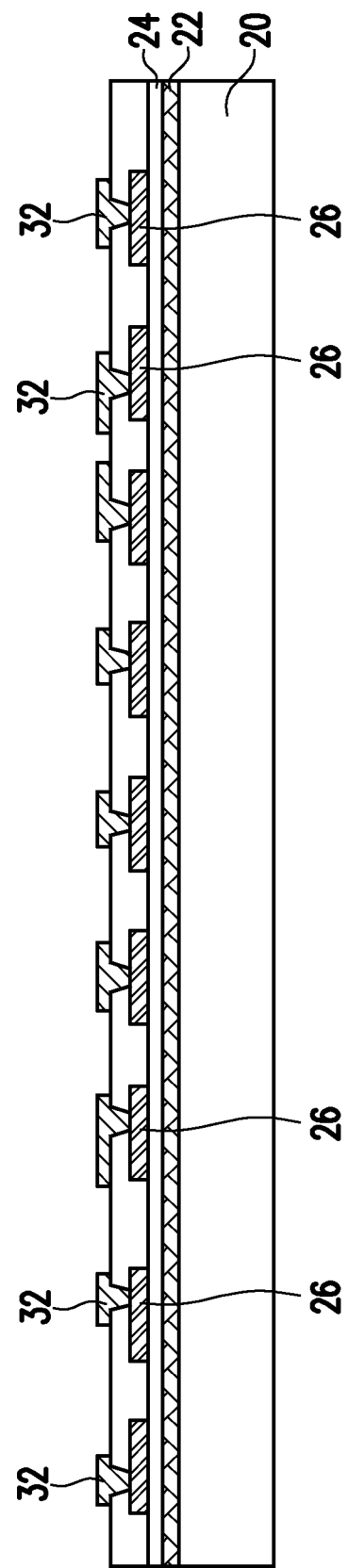

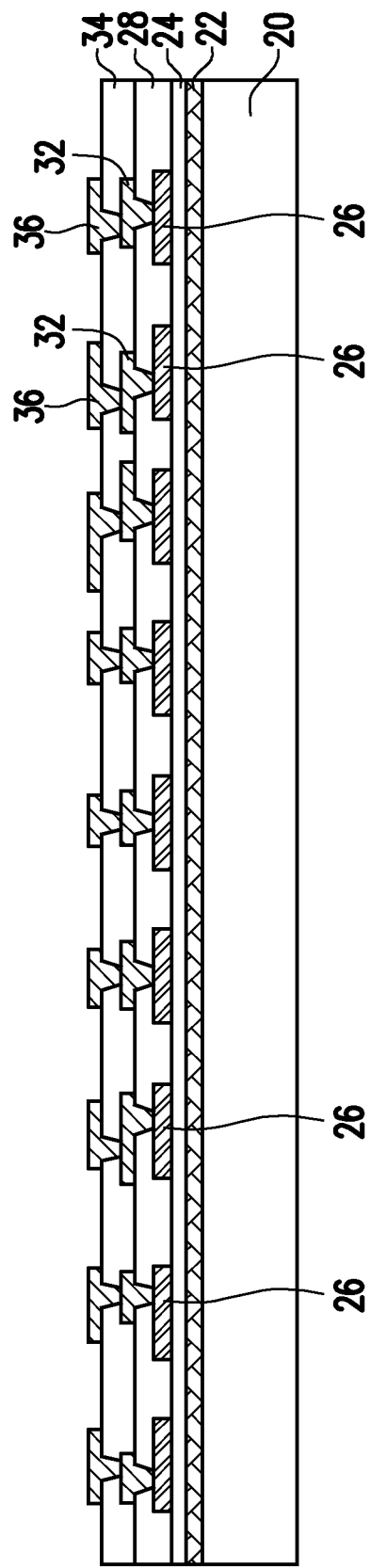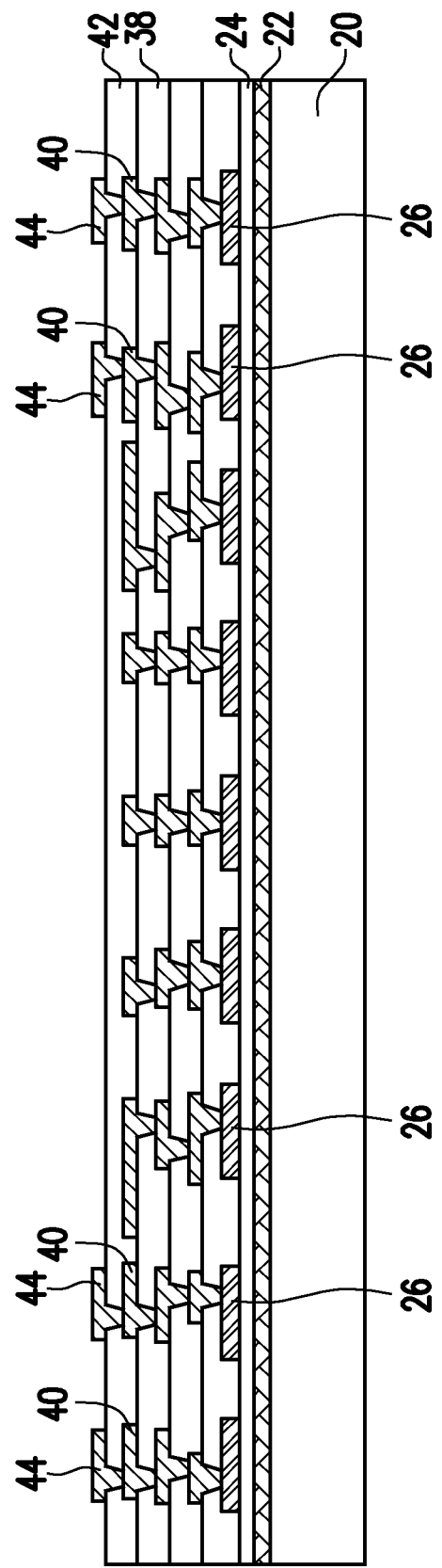

PACKAGES WITH SI-SUBSTRATE-FREE INTERPOSER AND METHOD FORMING SAME

PRIORITY CLAIM AND CROSS-REFERENCE

This application is a continuation of U.S. patent application Ser. No. 17/106,744, filed Nov. 30, 2020, and entitled "Packages with Si-Substrate-Free Interposer and Method Forming Same," which is a continuation of U.S. patent application Ser. No. 15/647,704, filed Jul. 12, 2017, and entitled "Packages with Si-Substrate-Free Interposer and Method Forming Same," now U.S. Pat. No. 10,854,568 issued Dec. 1, 2020, which claims the benefit of the U.S. Provisional Application No. 62/483,256, filed Apr. 7, 2017, and entitled "Packages with Si-substrate-free Interposer and Method forming Same," which applications are hereby incorporated herein by reference.

BACKGROUND

The packages of integrated circuits are becoming increasing complex, with more device dies packaged in the same package to achieve more functions. For example, a package may include a plurality of device dies such as processors and memory cubes bonded to a same interposer. The interposer may be formed based on a semiconductor substrate, with through-silicon vias formed in the semiconductor substrate to interconnect the features formed on the opposite sides of the interposer. A molding compound encapsulates the device dies therein. The package including the interposer and the device dies are further bonded to a package substrate. In addition, surface mount devices may also be bonded to the substrate. A heat spreader may be attached to the top surfaces of the device dies in order to dissipate the heat generated in the device dies. The heat spreader may have a skirt portion fixed onto the package substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 20 illustrate the cross-sectional views of intermediate stages in the formation of silicon-substrate-free (Si-less) packages in accordance with some embodiments.

DETAILED DESCRIPTION

Figure 5:
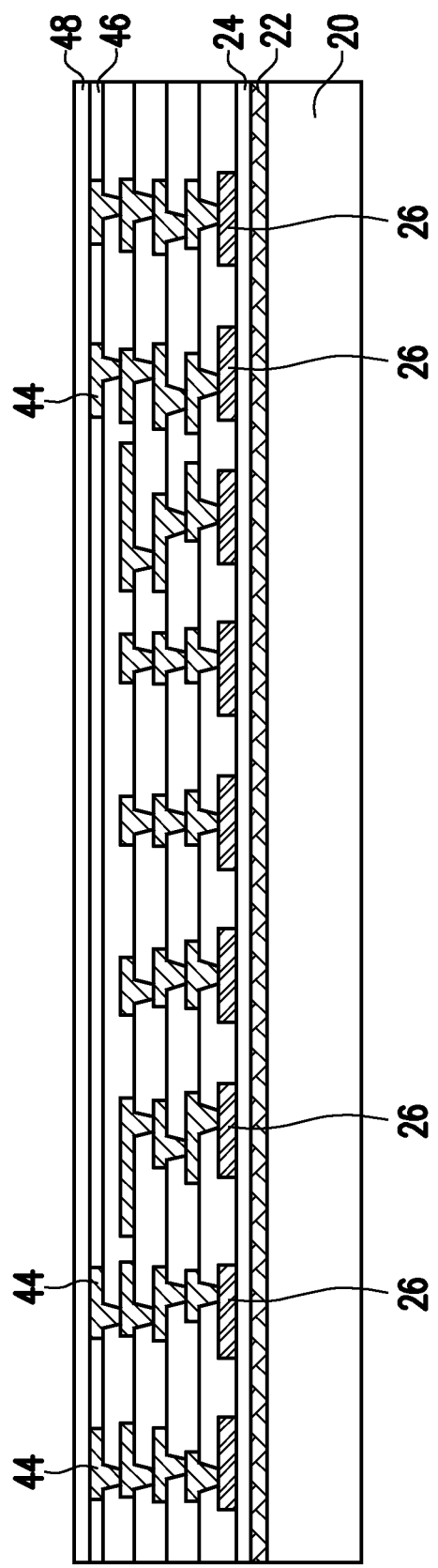

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package formed based on a silicon-substrate-free (Si-less) interposer and the method of forming the same are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

FIGS. 1 through 20 illustrate the cross-sectional views of intermediate stages in the formation of a package in accordance with some embodiments of the present disclosure. The steps shown in FIGS. 1 through 20 are also reflected schematically in the process flow 300 shown in FIG. 25.

FIG. 1 illustrates carrier 20 and release layer 22 formed on carrier 20. Carrier 20 may be a glass carrier, a silicon wafer, an organic carrier, or the like. Carrier 20 may have a round top-view shape, and may have a size of a common silicon wafer. For example, carrier 20 may have an 8-inch diameter, a 12-inch diameter, or the like. Release layer 22 may be formed of a polymer-based material (such as a Light To Heat Conversion (LTHC) material), which may be removed along with carrier 20 from the overlying structures that will be formed in subsequent steps. In accordance with some embodiments of the present disclosure, release layer 22 is formed of an epoxy-based thermal-release material. Release layer 22 may be coated onto carrier 20. The top surface of release layer 22 is leveled and has a high degree of co-planarity.

Dielectric layer 24 is formed on release layer 22. In accordance with some embodiments of the present disclosure, dielectric layer 24 is formed of a polymer, which may also be a photo-sensitive material such as polybenzoxazole (PBO), polyimide, benzocyclobutene (BCB), or the like, that may be easily patterned using a photo lithography process.

Redistribution Lines (RDLs) 26 are formed over dielectric layer 24. The formation of RDLs 26 may include forming a seed layer (not shown) over dielectric layer 24, forming a patterned mask (not shown) such as a photo resist over the seed layer, and then performing a metal plating on the exposed seed layer. The patterned mask and the portions of the seed layer covered by the patterned mask are then removed, leaving RDLs 26 as in FIG. 1. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-less plating.

Further referring to FIG. 1, dielectric layer 28 is formed on RDLs 26. The bottom surface of dielectric layer 28 is in contact with the top surfaces of RDLs 26 and dielectric layer 24. In accordance with some embodiments of the present disclosure, dielectric layer 28 is formed of a polymer, which may be a photo-sensitive material such as PBO, polyimide, BCB, or the like. Dielectric layer 28 is then patterned to form openings 30 therein. Hence, some portions of RDLs 26 are exposed through the openings 30 in dielectric layer 28.

Figure 25:
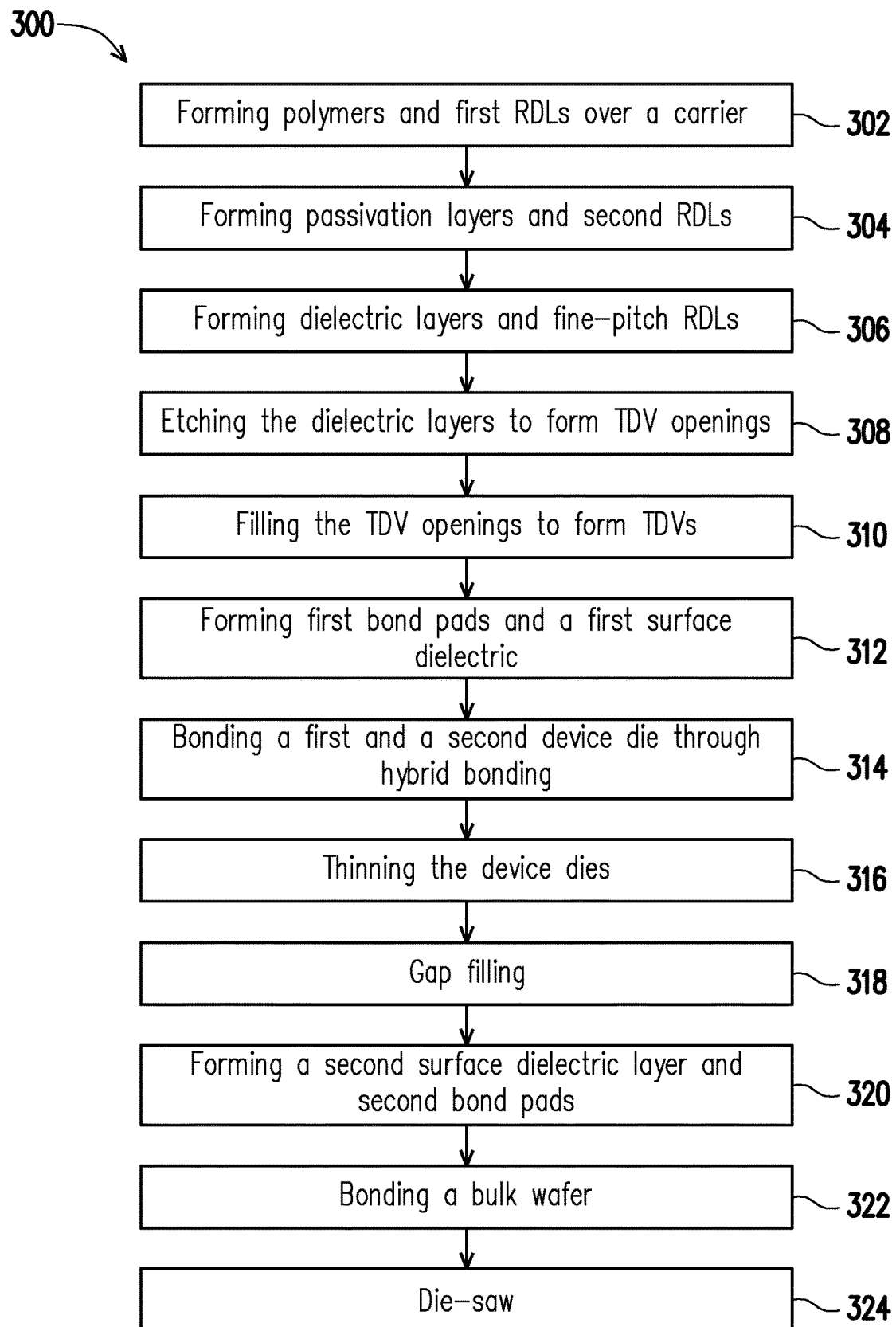
FIG. 25 illustrates a process flow for forming a package in accordance with some embodiments.

Next, referring to FIG. 2, RDLs 32 are formed to connect to RDLs 26. RDLs 32 include metal traces (metal lines) over dielectric layer 28. RDLs 32 also include vias extending into the openings in dielectric layer 28. RDLs 32 are also formed in a plating process, wherein each of RDLs 32 includes a seed layer (not shown) and a plated metallic material over the seed layer. The seed layer and the plated material may be formed of the same material or different materials. RDLs 32 may include a metal or a metal alloy including aluminum, copper, tungsten, and alloys thereof. The steps for forming dielectric layers 28 and 34 and RDLs 32 and 36 are represented as step 302 in the process flow 300 as shown in FIG. 25.

Referring to FIG. 3, dielectric layer 34 is formed over RDLs 32 and dielectric layer 28. Dielectric layer 34 may be formed using a polymer, which may be selected from the same candidate materials as those of dielectric layer 28. For example, dielectric layer 34 may be formed of PBO, polyimide, BCB, or the like. Alternatively, dielectric layer 34 may include an non-organic dielectric material such as silicon oxide, silicon nitride, silicon carbide, silicon oxynitride, or the like.

FIG. 3 further illustrates the formation of RDLs 36, which are electrically connected to RDLs 32. The formation of RDLs 36 may adopt the methods and materials similar to those for forming RDLs 32. It is appreciated that although in the illustrative exemplary embodiments, two polymer layers 28 and 34 and the respective RDLs 32 and 36 formed therein are discussed, fewer or more dielectric layers may be adopted, depending on the routing requirement and the requirement of using polymers for buffering stress. For example, there may be a single polymer layer or three, four, or more polymer layers.

FIG. 4 illustrates the formation of passivation layers 38 and 42 and RDLs 40 and 44. The respective step is illustrated as step 304 in the process flow 300 as shown in FIG. 25. In accordance with some embodiments of the present disclosure, passivation layers 38 and 42 are formed of inorganic materials such as silicon oxide, silicon nitride, silicon carbide, silicon oxynitride, silicon oxy-carbo-nitride, Un-doped Silicate Glass (USG), or multiplayers thereof. Each of passivation layers 38 and 42 may be a single layer or a composite layer, and may be formed of a non-porous material. In accordance with some embodiments of the present disclosure, one or both of passivation layers 38 and 42 is a composite layer including a silicon oxide layer (not shown separately), and a silicon nitride layer (not shown separately) over the silicon oxide layer. Passivation layers 38 and 42 have the function of blocking moisture and detrimental chemicals from accessing the conductive features such as fine-pitch RDLs in the package, as will be discussed in subsequent paragraphs.

Figure 11:
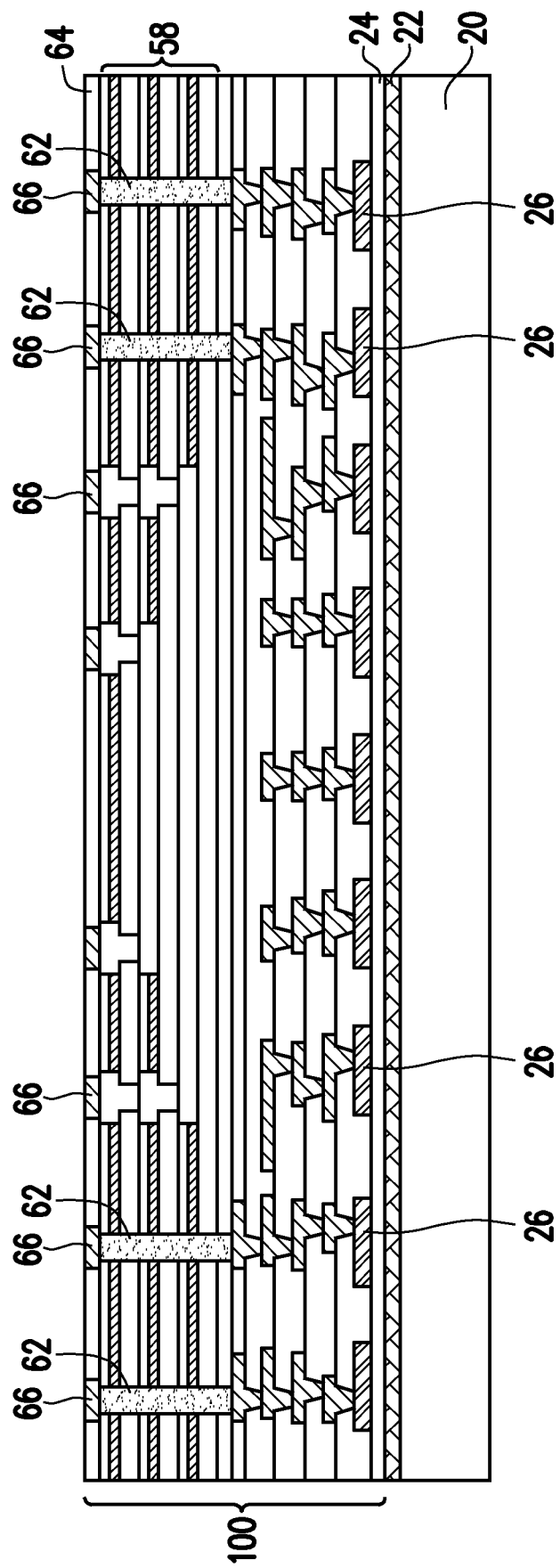

RDLs 40 and 44 may be formed of aluminum, copper, aluminum copper, nickel, or alloys thereof. In accordance with some embodiments, some portions of RDLs 44 are formed as metal pads that are large enough for landing the subsequently formed Through-Dielectric Vias (TDVs), as shown in FIG. 11. These metal pads are accordingly referred to as metal pads 44 or aluminum pads 44 in accordance with some embodiments. Also, the number of passivation layers may be any integer number such as one, two (as illustrated), three, or more.

FIG. 5 illustrates the formation of one or a plurality of dielectric layers. For example, as illustrated, dielectric layer 46 may be formed to embed the top RDLs 44 therein. Dielectric layer 48 is formed over dielectric layer 46, and may act as an etch stop layer. In accordance with some embodiments of the present disclosure, dielectric layers 46 and 48 can also be replaced with a single dielectric layer. The available materials of dielectric layers 46 and 48 include silicon oxide, silicon nitride, silicon carbide, silicon oxynitride, or the like.

Figure 6:
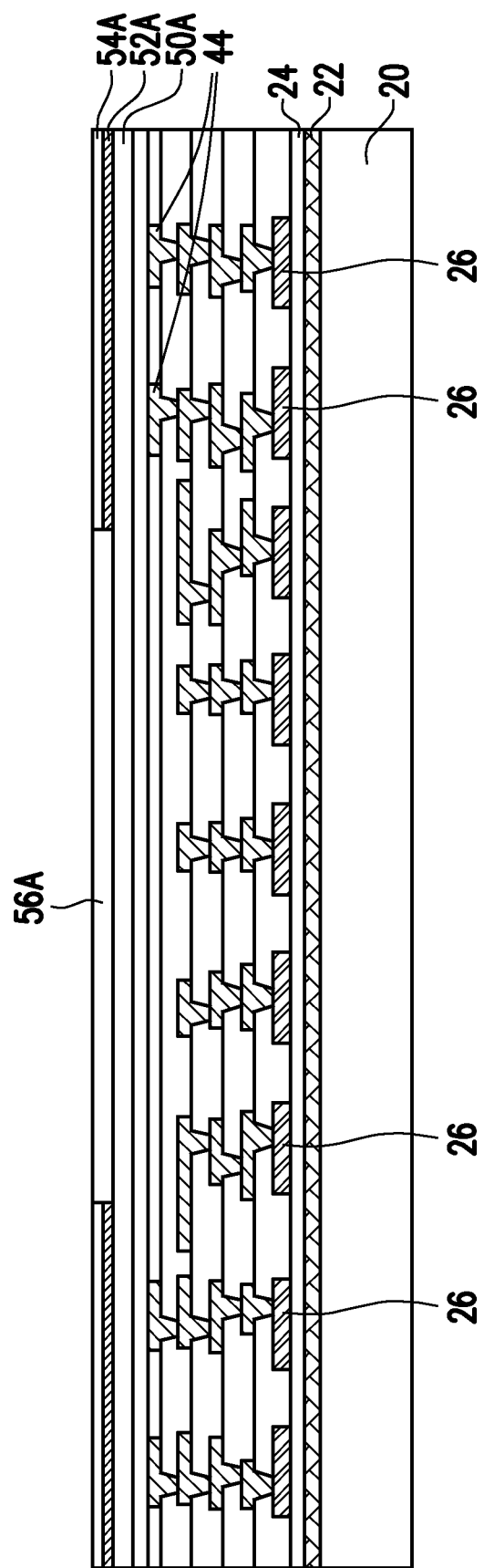
Figure 7:
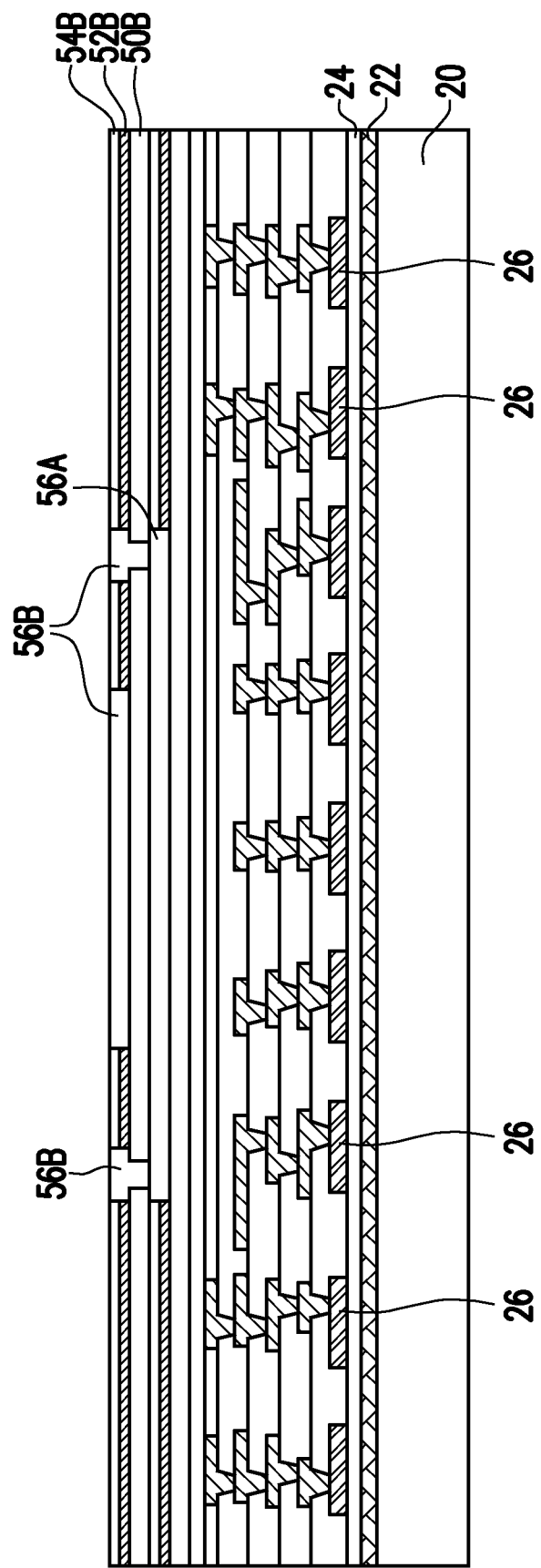
Figure 8:
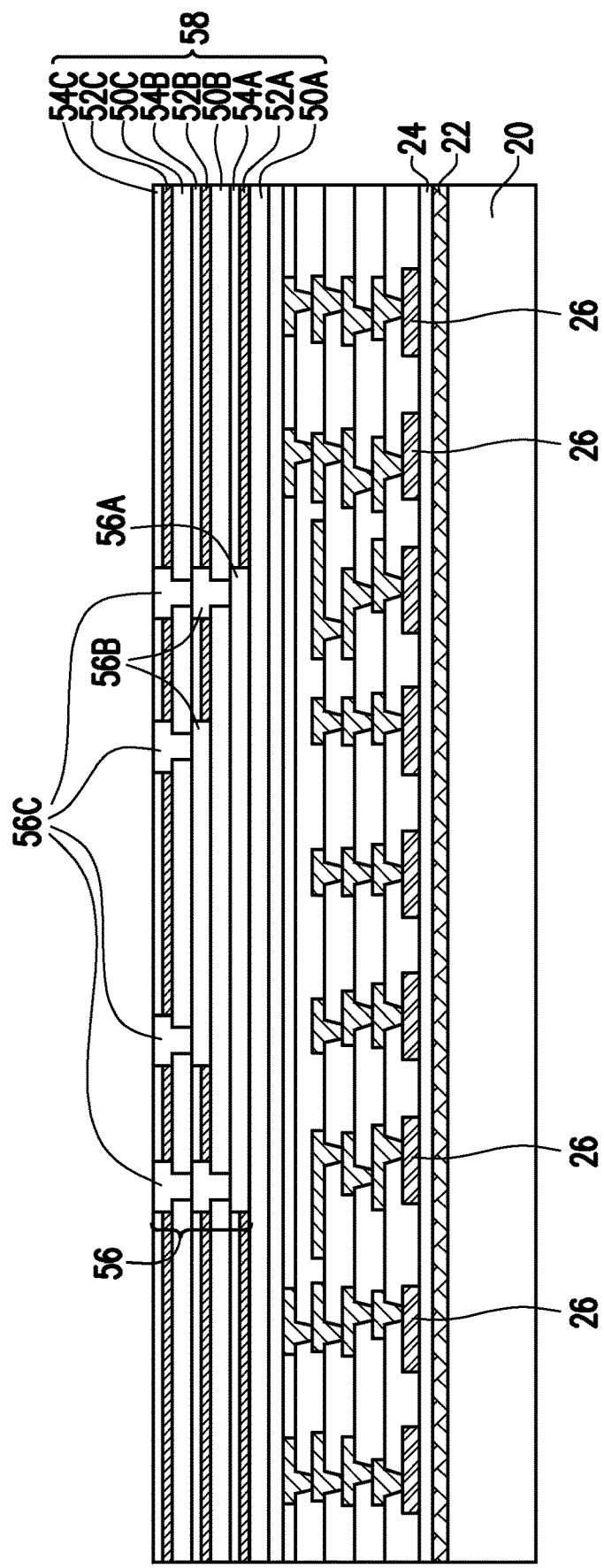

FIGS. 6, 7, and 8 illustrate the formation of dielectric layers and fine-pitch RDLs in accordance with some embodiments of the present disclosure. The respective step is illustrated as step 306 in the process flow 300 as shown in FIG. 25. The formation methods may adopt the method for forming interconnect structure for device dies based on silicon substrates. For example, the formation methods of the interconnect structure may include single damascene and/or dual damascene processes. Accordingly, the resulting RDLs are also alternatively referred to as metal lines and vias, and the corresponding dielectric layers are alternatively referred to as Inter-Metal-Dielectric (IMD) layers.

Referring to FIG. 6, dielectric layers 50A and 54A and etch stop layer 52A are formed. Dielectric layers 50A and 54A may be formed of silicon oxide, silicon oxynitride, silicon nitride, or the like, or low-k dielectric materials having k values lower than about 3.0. The low-k dielectric materials may include Black Diamond (a registered trademark of Applied Materials), a carbon-containing low-k dielectric material, Hydrogen SilsesQuioxane (HSQ), MethylSilsesQuioxane (MSQ), or the like. Etch stop layer 52A is formed of a material having a high etching selectivity relative to dielectric layers 50A and 54A, and may be formed of silicon carbide, silicon carbo-nitride, etc. In accordance with alternative embodiments, etch stop layer 52A is not formed.

Fine-pitch RDLs 56A are formed in dielectric layers 52A and 54A for routing. It is appreciated that the single illustrated fine-pitch RDLs 56A represents a plurality of fine-pitch RDLs. Since the fine-pitch RDLs in accordance with some embodiments of the present disclosure are formed using damascene processes, it can be formed very thin with pitches (viewed from the top of the structure) smaller than, for example, 0.8 μm. This significantly improves the density of the fine-pitch RDLs and the routing ability. In accordance with some embodiments, fine-pitch RDLs 56A are formed using a single damascene process, which includes etching dielectric layers 50A and 52A to form trenches, filling the trenches with a conductive material(s), and performing a planarization such as Chemical Mechanical Polish (CMP) or mechanical grinding to remove the portions the conductive material over dielectric layer 54A.

In accordance with some embodiments of the present disclosure, the conductive material for forming fine-pitch RDLs 56A is a homogenous material. In accordance with other embodiments of the present disclosure, the conductive material is a composite material including a barrier layer formed of titanium, titanium nitride, tantalum, tantalum nitride, or the like, and a copper-containing material (which may be copper or copper alloy) over the barrier layer. Fine-pitch RDLs 56A may also be formed of a dual damascene process, so that some vias may be formed underlying some fine-pitch RDLs 56A, and the vias may be used to connect the fine-pitch RDLs 56A to RDLs 44.

FIG. 7 illustrates the formation of dielectric layers 50B and 54B and etch stop layer 52B. The materials of dielectric layers 50B and 54B may be selected from the same candidate materials for forming dielectric layers 50A and 54A, and the material of etch stop layer 52B may be selected from the same candidate materials for forming etch stop layer 52A.

Fine-pitch RDLs 56B are also formed in dielectric layers 50B, 52B, and 54B. Fine-pitch RDLs 56B include metal lines formed in dielectric layer 54B and vias in dielectric layer 50B and 52B. Although FIG. 7 shows that the metal lines extend into etch stop layer 52B due to over-etching, the metal lines in RDLs 56B may actually stop on the top surface of, and do not penetrate through, etch stop layer 52B. The formation may include a dual damascene process, which include forming trenches in dielectric layer 54B and via openings in dielectric layers 50B and 52B, filling a conductive material(s), and then performing a planarization such as mechanical grinding or Chemical Mechanical Polish (CMP). Similarly, fine-pitch RDLs 56B may be formed of a homogenous material, or may be formed of a composite material including a barrier layer and a copper-containing material over the barrier layer.

FIG. 8 illustrates the formation of dielectric layers 50C and 54C and etch stop layer 52C, and fine-pitch RDLs 56C. The formation method and the materials may be similar to the underlying respective layers, and hence are not repeated herein. Also, etch stop layers 52A, 52B, and 52C may be omitted in accordance with some embodiments, and the corresponding etching for forming trenches may be performed using a time-mode to control the depths of the trenches. It is appreciated that there may be more dielectric layers and layers of fine-pitch RDLs formed. In addition, even if some or all of etch stop layers 52A, 52B, and 52C may be skipped, since the dielectric layers in which the fine-pitch RDLs are located are formed in different processes, there may be distinguishable interfaces between the dielectric layers for forming fine-pitch RDLs 56A, 56B, and 56C, regardless of whether these dielectric layers are formed of the same dielectric material or different dielectric materials. In subsequent paragraphs, dielectric layers 50A, 52A, 54A, 50B, 52B, 54B, 50C, 52C, and 54C are collectively and individually referred to as dielectric layers 58 for the simplicity in identification. Fine-pitch RDLs 56A, 56B, and 56C are also collectively and individually referred to as fine-pitch RDLs 56. Similarly, although FIG. 8 shows that the metal lines in RDLs 56C extend into etch stop layer 52C due to over-etching, the metal lines in RDLs 56C may actually stop on the top surface of, and do not penetrate through, etch stop layer 52C.

Figure 9:
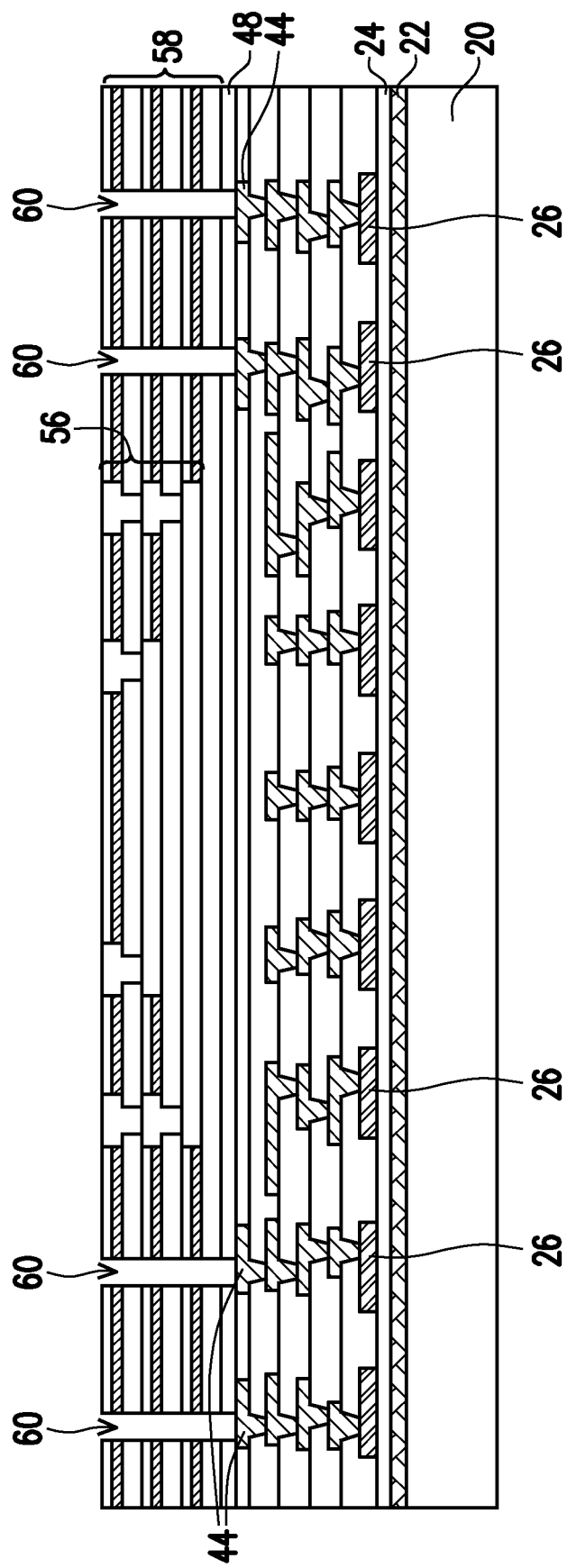

Referring to FIG. 9, dielectric layers 48 and 58 are etched to form Through-Dielectric Via (TDV) openings 60. The respective step is illustrated as step 308 in the process flow 300 as shown in FIG. 25. Metal pads 44 are exposed to TDV openings 60. When viewed from the top of the structure shown in FIG. 9, via openings 60 may be aligned to ring to encircle the regions in which the fine-pitch RDLs 56 are formed. The top-view shapes of via openings 60 may be rectangles, circles, hexagons, or the like.

Figure 10:
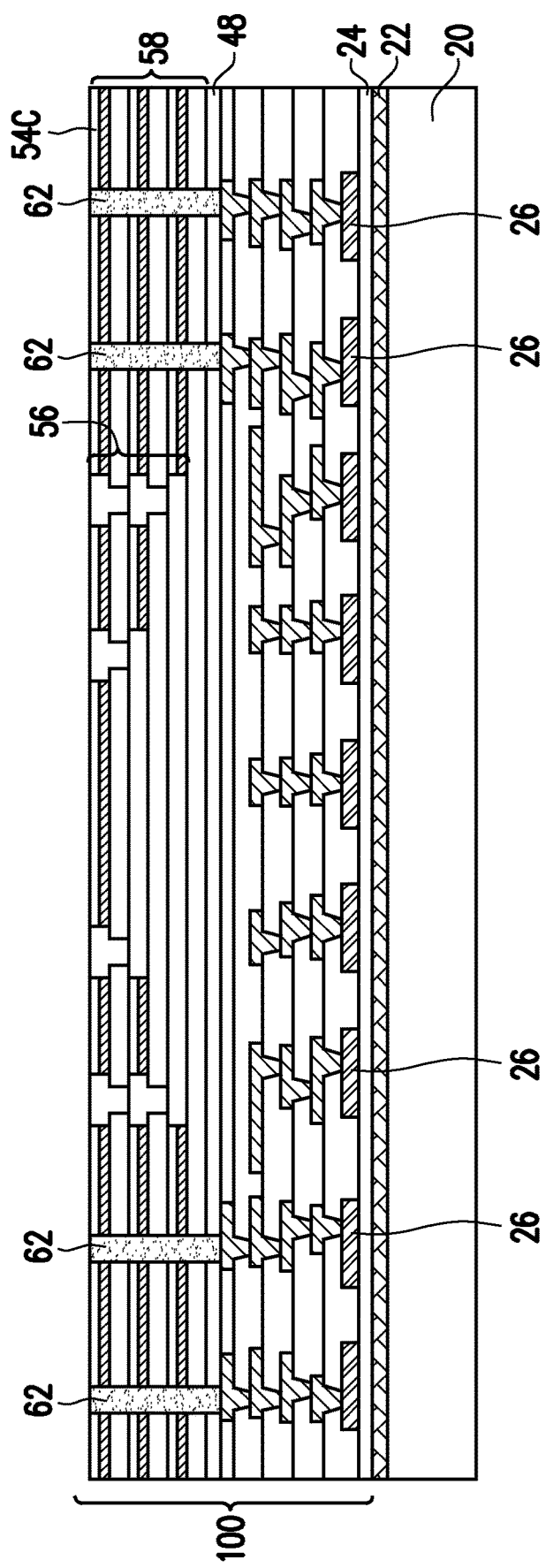

Next, TDV openings 60 are filled with a conductive material(s) to form TDVs 62, and the resulting structure is shown in FIG. 10. The respective step is illustrated as step 310 in the process flow 300 as shown in FIG. 25. In accordance with some embodiments of the present disclosure, TDVs 62 are formed of a homogenous conductive material, which may be a metal or a metal alloy including copper, aluminum, tungsten, or the like. In accordance with alternative embodiments of the present disclosure, TDVs 62 have a composite structure including a conductive barrier layer formed of titanium, titanium nitride, tantalum, tantalum nitride, or the like, and a metal-containing material over the barrier layer. In accordance with some embodiments of the present disclosure, a dielectric isolation layer is formed to encircle each of TDVs 62. In accordance with alternative embodiments, no dielectric isolation layers are formed to encircle TDVs 62, and TDVs 62 are in physical contact with dielectric layers 58. The formation of TDVs 62 also include depositing the conductive material into the TDV openings 60 (FIG. 9), and performing a planarization to remove excess portions of the deposited material over dielectric layers 58.

FIG. 11 illustrates the formation of bond pads 66 and dielectric layer 64, and bond pads 66 are located in dielectric layer 64. Throughout the description, dielectric layer 64 is alternatively referred to as an insulation layer or a dielectric insulation region. The respective step is illustrated as step 312 in the process flow 300 as shown in FIG. 25. Bond pads 66 may be formed of a metal that is easy for forming hybrid bonding. In accordance with some embodiments of the present disclosure, bond pads 66 are formed of copper or a copper alloy. Dielectric layer 64 may be formed of silicon oxide, for example. The top surfaces of bond pads 66 and dielectric layer 64 are coplanar. The planarity may be achieved, for example, through a planarization step such as a CMP or a mechanical grinding step.

Throughout the description, the components over layer 22 are in combination referred to as interposer 100. Interposer 100, different from conventional interposers that were formed based on silicon substrates, are formed based on dielectric layers 58. No silicon substrate is in interposer 100, and hence interposer 100 is referred to as a silicon-substrate-free interposer or a Si-less interposer. TDVs 62 are formed in dielectric layers 58 to replace conventional through-silicon vias. Since silicon substrate is semiconductive, it may adversely affect the performance of the circuits and the connections formed therein and thereon. For example, there is degradation of signal caused by silicon substrate, and such degradation may be avoided in the embodiments of the present disclosure since the TDVs 62 are formed in dielectric layers.

Figure 12:
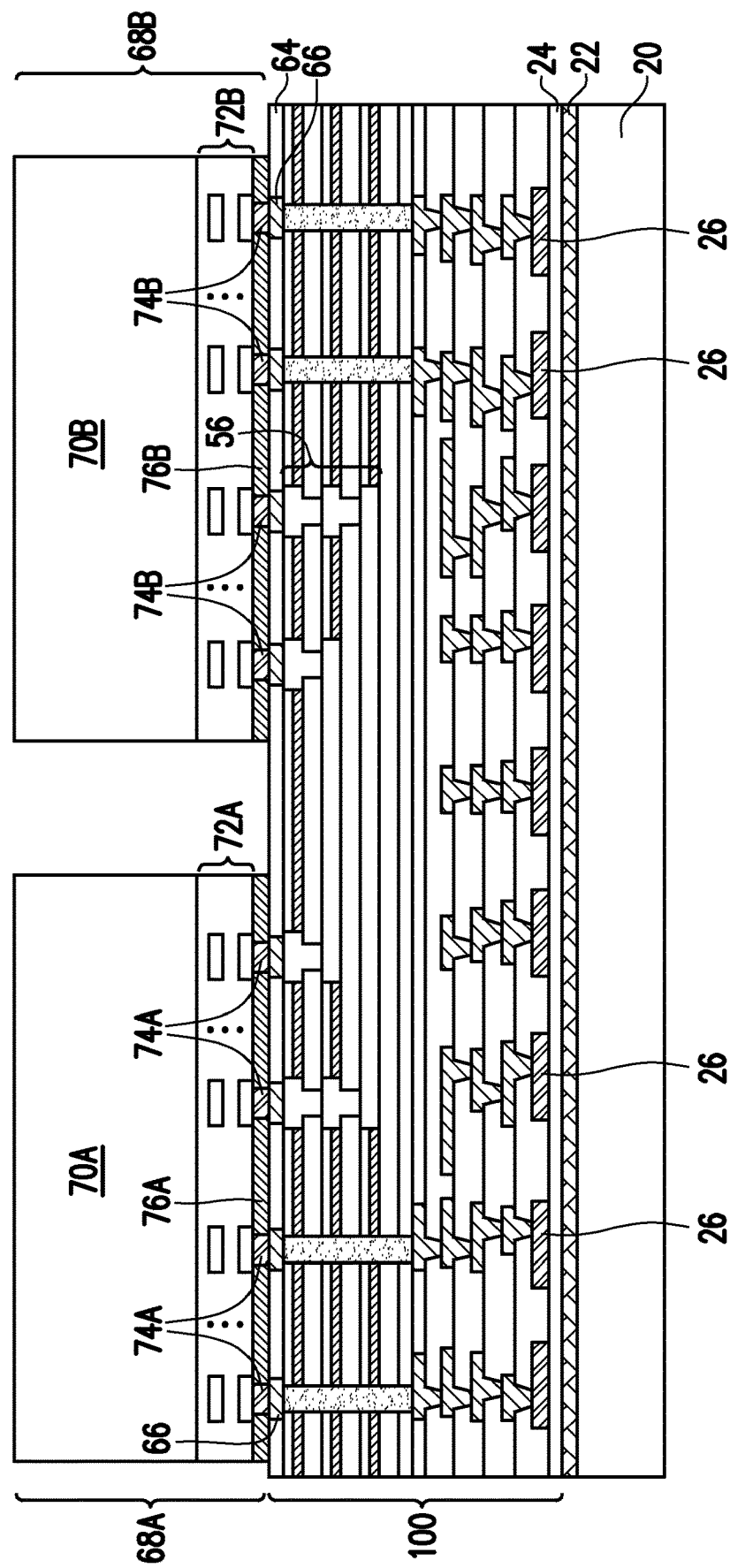

Next, devices 68A and 68B are bonded to interposer 100, as shown in FIG. 12. The respective step is illustrated as step 314 in the process flow 300 as shown in FIG. 25. Devices 68A and 68B may be device dies, and hence are referred to as device dies hereinafter, while they can be other types of devices such as packages. In accordance with some embodiments of the present disclosure, device dies 68A and 68B may include a logic die, which may be a Central Processing Unit (CPU) die, a Micro Control Unit (MCU) die, an input-output (IO) die, a BaseBand (BB) die, or an Application processor (AP) die. Device dies 68A and 68B may also include a memory die. Device dies 68A and 68B include semiconductor substrates 70A and 70B, respectively, which may be silicon substrates. Also, device dies 68A and 68B include interconnect structures 72A and 72B, respectively, for connecting to the active devices and passive devices in device dies 68A and 68B. Interconnect structures 72A and 72B include metal lines and vias (not shown).

Device die 68A includes bond pads 74A and dielectric layer 76A at the illustrated bottom surface of device die 68A. The illustrated bottom surfaces of bond pads 74A are coplanar with the illustrated bottom surface of dielectric layer 76A. Device die 68B includes bond pads 74B and dielectric layer 76B at the illustrated bottom surface. The illustrated bottom surfaces of bond pads 74B are coplanar with the illustrated bottom surface of dielectric layer 76B.

The bonding may be achieved through hybrid bonding. For example, bond pads 74A and 74B are bonded to bond pads 66 through metal-to-metal direct bonding. In accordance with some embodiments of the present disclosure, the metal-to-metal direct bonding is copper-to-copper direct bonding. Furthermore, dielectric layers 76A and 76B are bonded to dielectric layer 64, for example, with Si—O—Si bonds generated. The hybrid bonding may include a pre-bonding and an anneal, so that the metals in bond pads 74A (and 74B) inter-diffuse with the metals in the respective underlying bond pads 66.

Fine-pitch RDLs 56 electrically interconnect bond pads 74A and bond pads 74B, and are used for the signal communication between device dies 68A and 68B. Fine-pitch RDLs 56 have small pitches and small widths. Accordingly, the density of fine-pitch RDLs 56 is high, and hence enough communication channels may be formed for the direct communication between device dies 68A and 68B. On the other hand, TDVs 62 provide direct connection from device dies 68A and 68B to the component (which may be a package substrate, a Printed Circuit Board (PCB), or the like) that will be bonded to interposer 100. Furthermore, the bonding between bond pads 74A/74B and 66 are through bond pads rather than through solder joints, which are typically much larger than bond pads. Accordingly, the horizontal sizes of the bonds are small, and more bonds can be implemented to provide enough communication channels.

Figure 13:
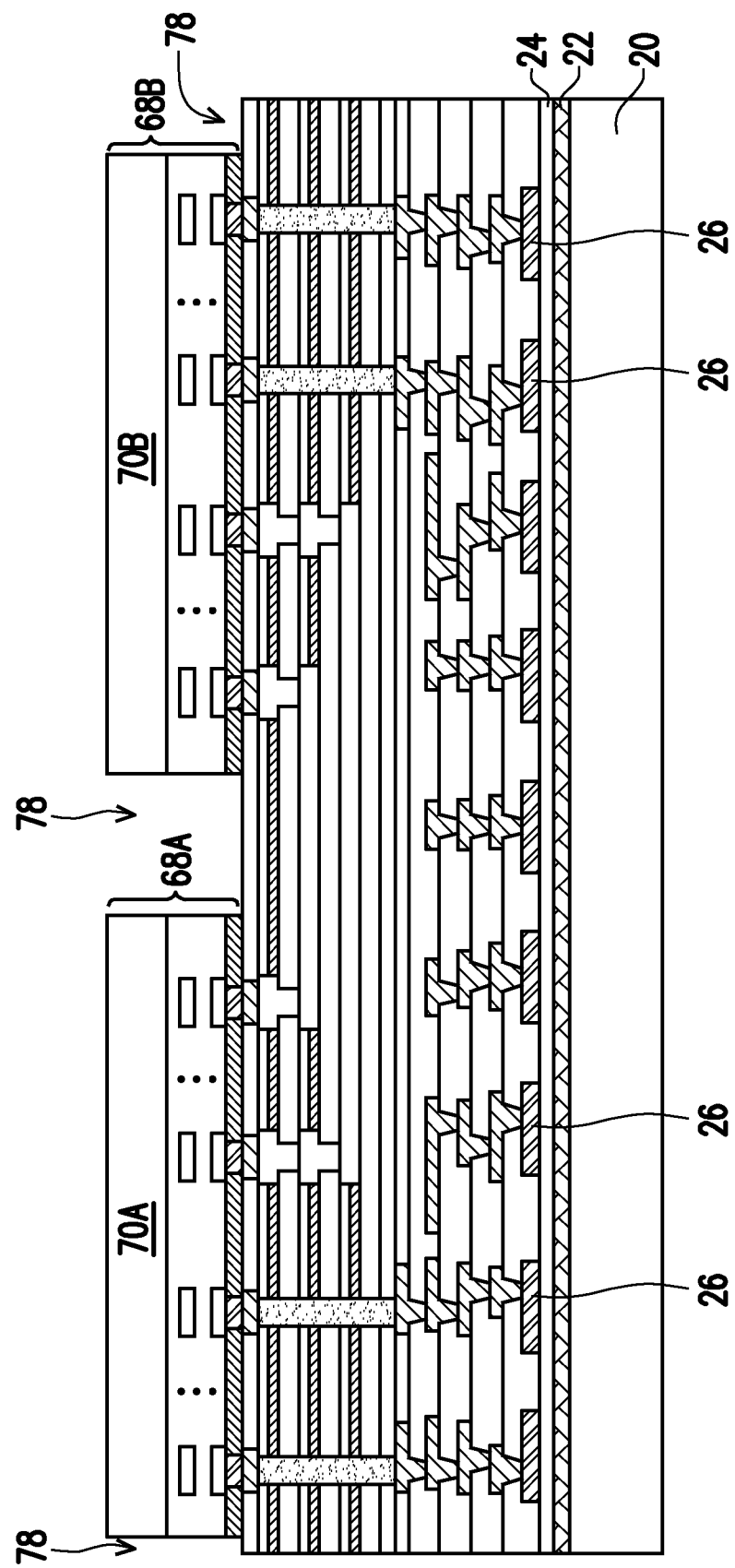

Referring to FIG. 13, a backside grinding is performed to thin device dies 68A and 68B, for example, to a thickness between about 15 μm and about 30 μm. The respective step is illustrated as step 316 in the process flow 300 as shown in FIG. 25. Through the thinning, the aspect ratio of gaps 78 between neighboring device dies 68A and 68B is reduced in order to perform gap filling. Otherwise, the gap filling is difficult due to the otherwise high aspect ratio.

Figure 14:
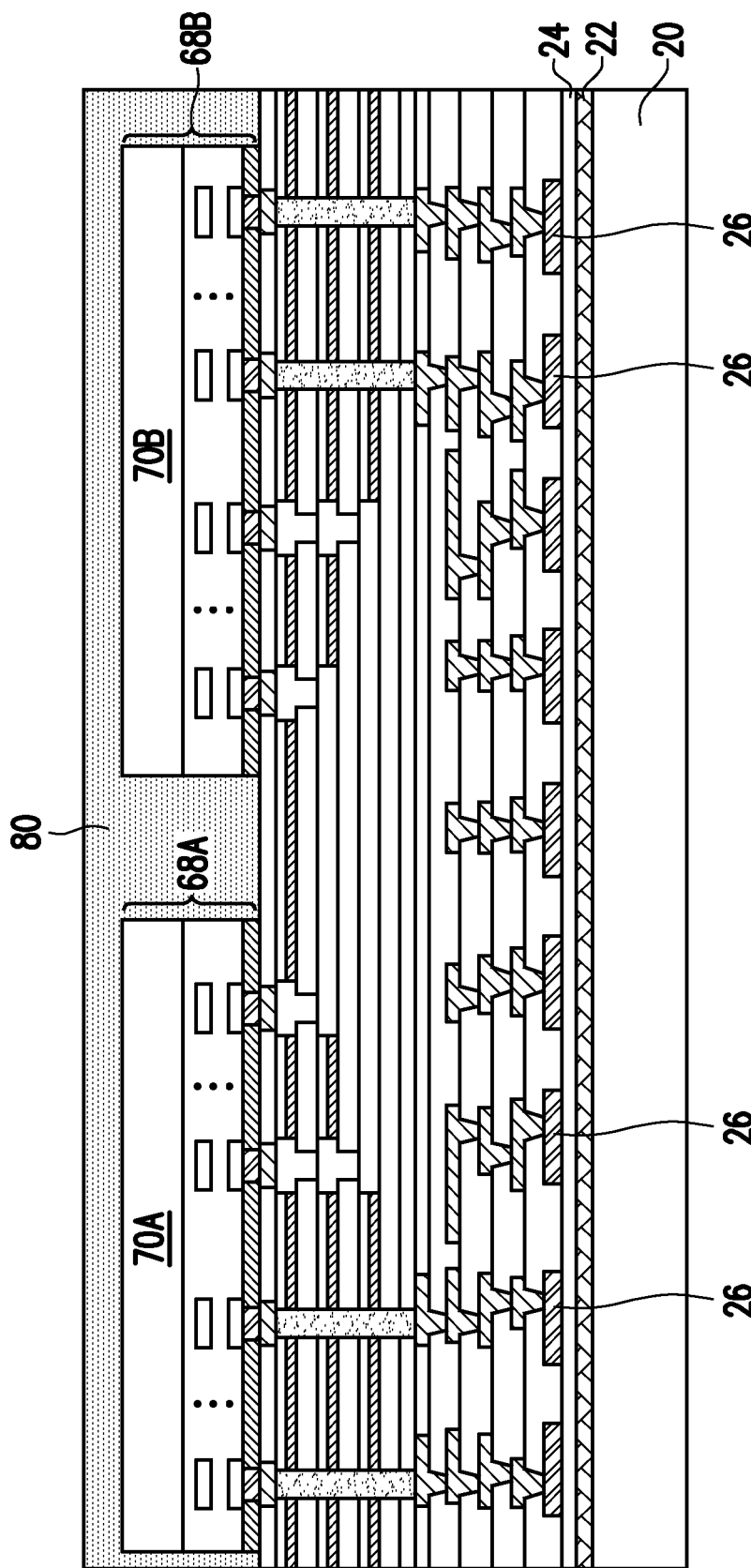
Figure 15A:
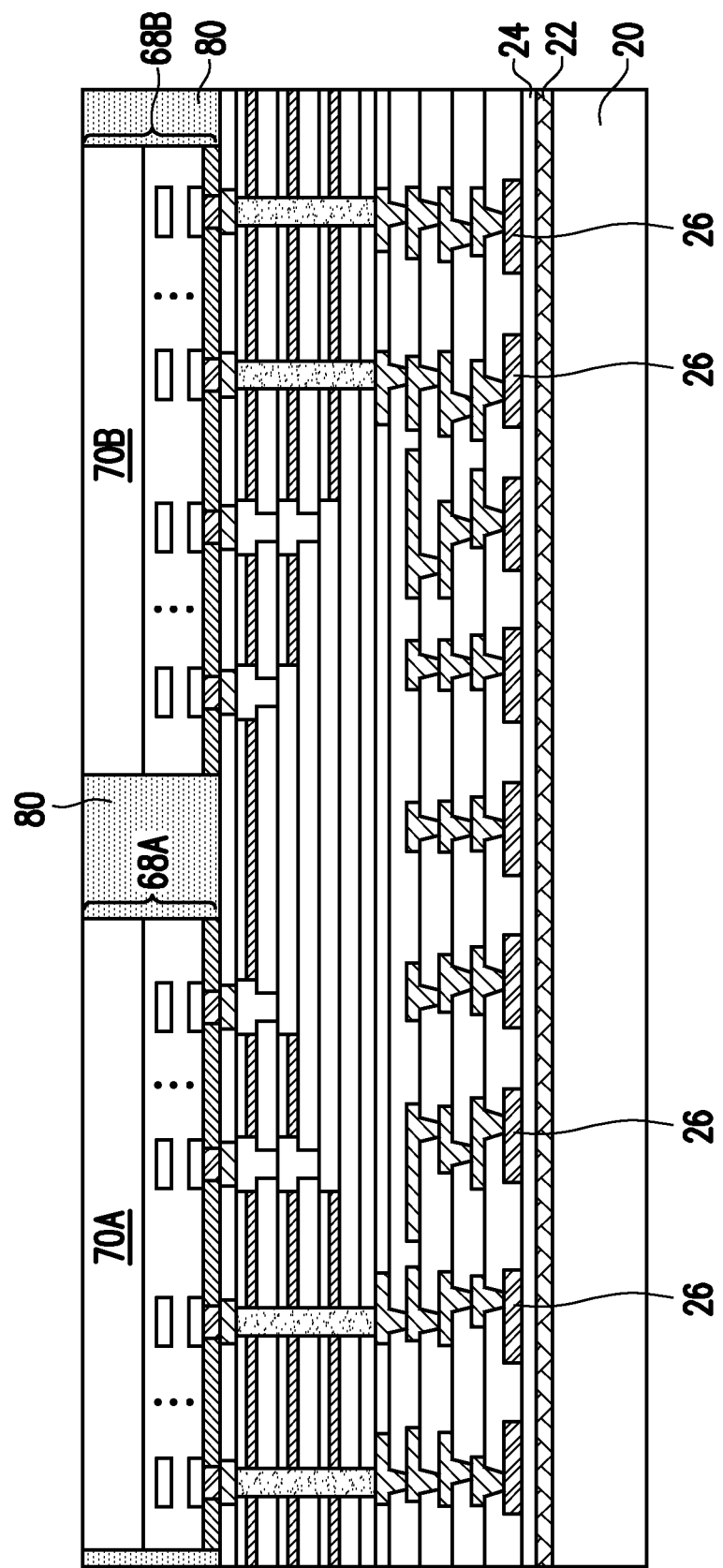
Figure 15B:
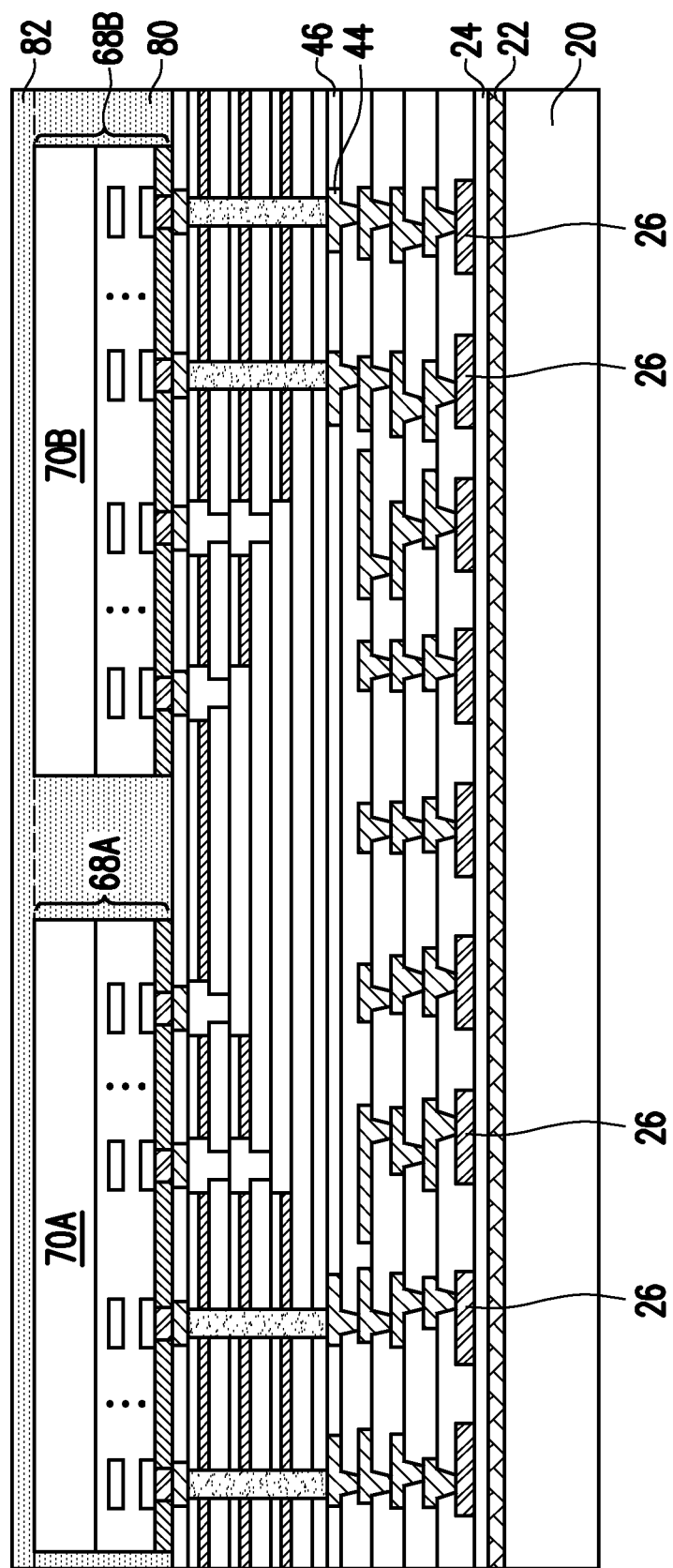

Next, gaps 78 are filled by gap-filling material 80, as shown in FIG. 14. The respective step is illustrated as step 318 in the process flow 300 as shown in FIG. 25. In accordance with some embodiments of the present disclosure, gap-filling material 80 includes an oxide such as silicon oxide, which may be formed of tetraethyl orthosilicate (TEOS). The formation method may include Chemical Vapor Deposition (CVD), High-Density Plasma Chemical Vapor Deposition (HDPCVD), or the like. In accordance with alternative embodiments, gap-filling material 80 is formed of a polymer such as PBO, polyimide, or the like. A planarization is then performed to remove excess portions of gap-filling material 80, so that substrates 70A and 70B of device dies 68A and 68B are revealed. The resulting structure is shown in FIG. 15A. In accordance with alternative embodiments of the present disclosure in which gap-filling material 80 is formed of an oxide (such as silicon oxide), a thin layer of gap-filling material 80 may be left over substrates 70A and 70B, and the resulting structure is shown in FIG. 15B. The remaining portion of gap-filling material 80 over device dies 68A and 68B is alternatively referred to as dielectric layer 82 or insulation layer 82 hereinafter.

Figure 16:
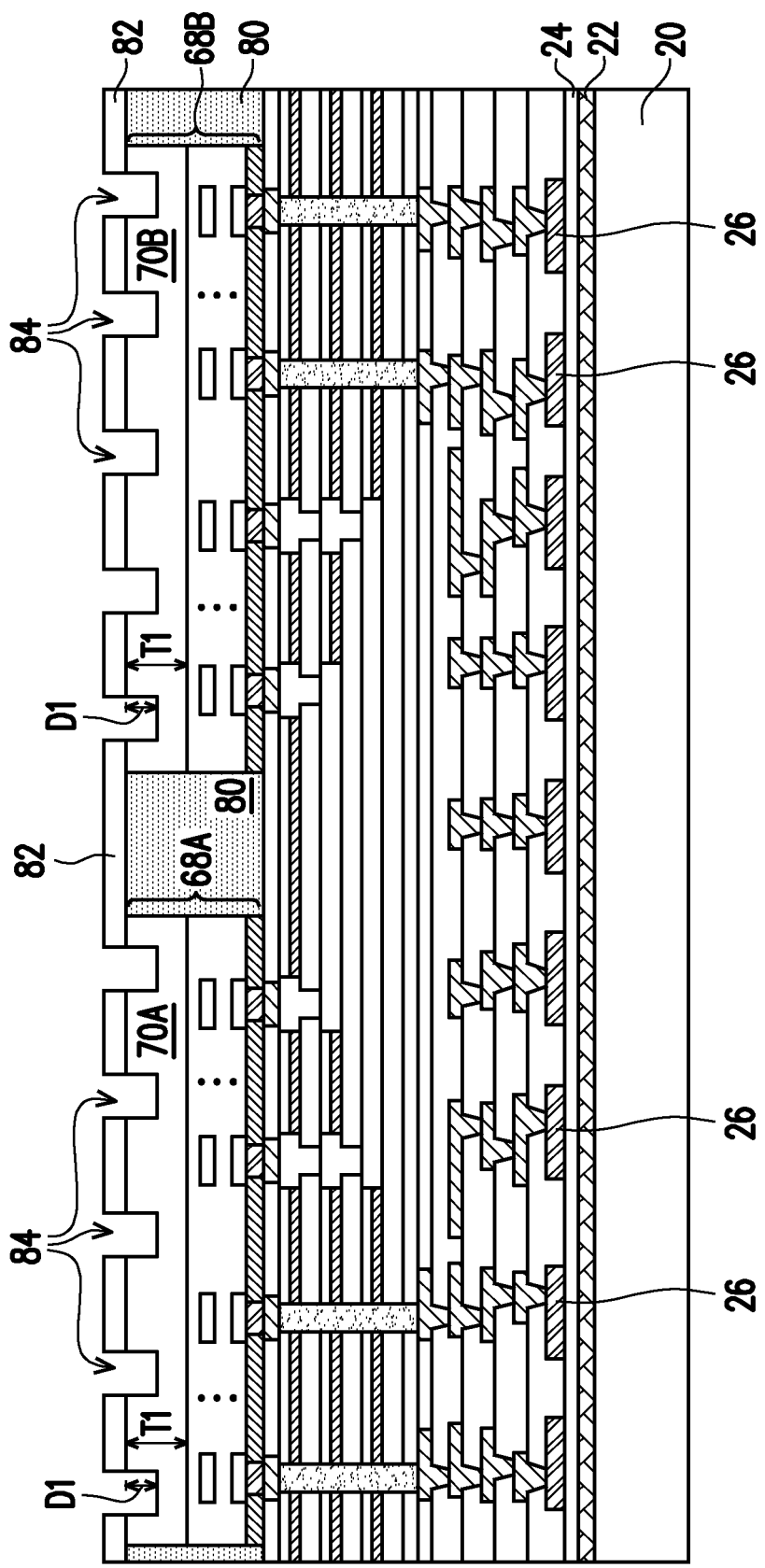

In accordance with the embodiments shown in FIG. 15A, in which substrates 70A and 70B are exposed, dielectric layer 82 is deposited (as shown in FIG. 16) as a blanket layer, for example, using CVD, Plasma Enhanced CVD (PECVD), Atomic Layer Deposition (ALD), or the like. The respective step is illustrated as step 320 in the process flow 300 as shown in FIG. 25. In accordance with alternative embodiments (as shown in FIG. 15B) in which a thin layer of gap-filling material 80 (which is also referred to as 82) is left over substrates 70A and 70B, the deposition of the dielectric layer may be skipped. Next, trenches 84 are formed by etching dielectric layer 82 and substrates 70A and 70B, so that trenches 84 also extend into dielectric layer 82 and substrates 70A and 70B. The resulting structure is shown in FIG. 16. Depth D1 of the portions of trenches 84 inside substrates 70A and 70B may be greater than about 1 μm, and may be between about 2 μm and about 5 μm, depending on the thickness T1 of substrates 70A and 70B. For example, depth D1 may be between about 20 percent and about 60 percent of thickness T1. It is appreciated that the values recited throughout the description are examples, and may be changed to different values.

Trenches 84 may be distributed in various patterns. For example, trenches 84 may be formed as discrete openings, which may be allocated as an array, a pattern of beehive, or other repeat patterns. The top-view shapes of trenches 84 may be rectangles, squares, circles, hexagons, or the like. In accordance with alternative embodiments, trenches 84, when viewed in the top view of the structure shown in FIG. 16, may be parallel trenches that extend in a single direction. Trenches 84 may also be interconnected to form a grid. The grid may include a first plurality of trenches parallel to each other and evenly or unevenly spaced, and a second plurality of trenches parallel to each other and evenly or unevenly spaced. The first plurality of trenches and the second plurality of trenches intercept with each other to form the grid, and the first plurality of trenches and the second plurality of trenches may or may not be perpendicular to each other in the top view.

Figure 17:
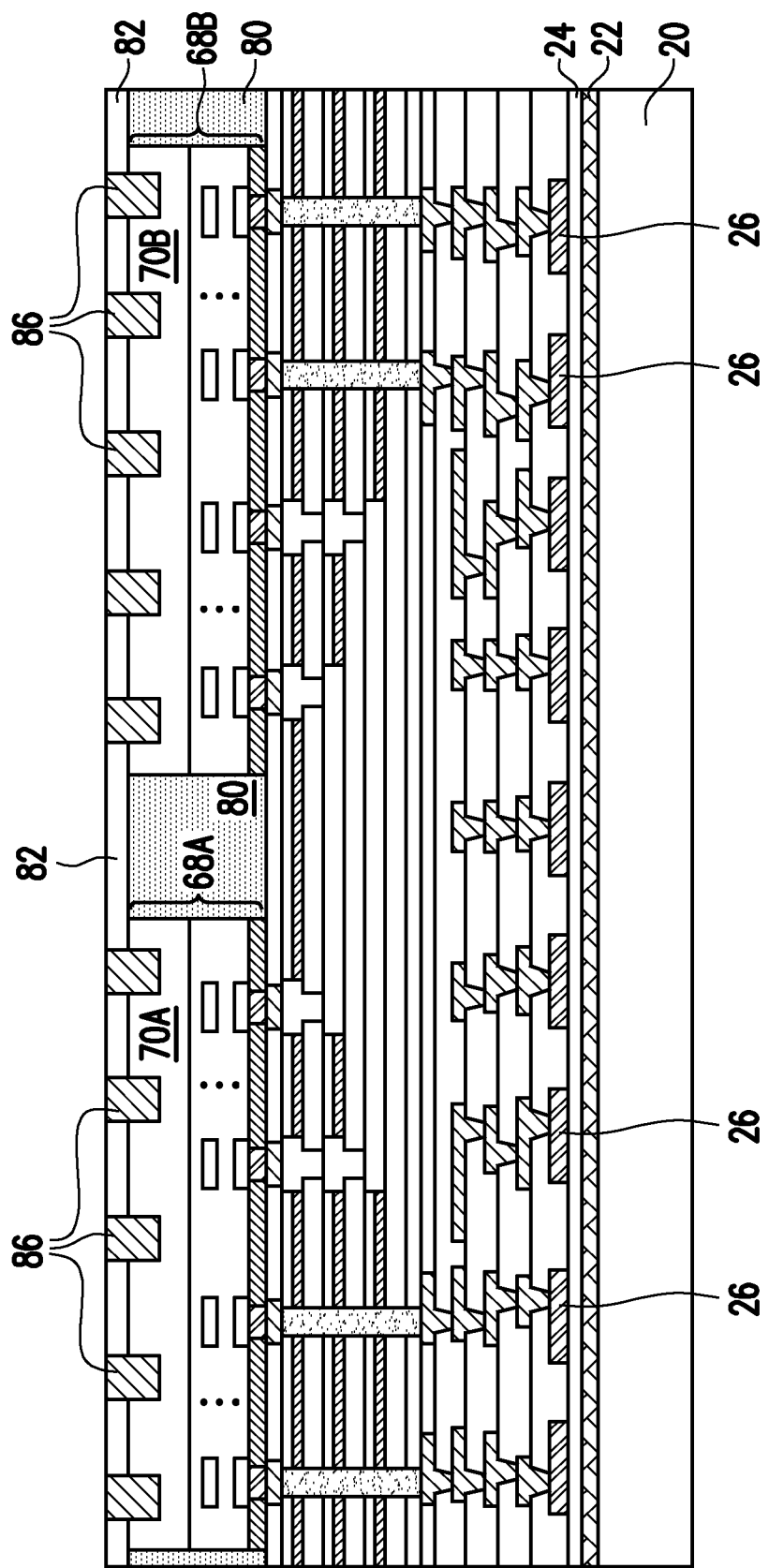

Trenches 84 are then filled to form bond pads 86, as shown in FIG. 17. The respective step is also illustrated as step 320 in the process flow 300 as shown in FIG. 25. It is appreciated that although features 86 are referred to as bond pads, features 86 may be discrete pads or interconnected metal lines. In accordance with some embodiments, bond pads 86 are formed of copper or other metals suitable for hybrid bonding (due to relatively easiness in diffusing). After the filling, a planarization is performed to planarize the top surfaces of bond pads 86 with the top surface of dielectric layer 82. The planarization may include a CMP or a mechanical grinding process.

Figure 18A:
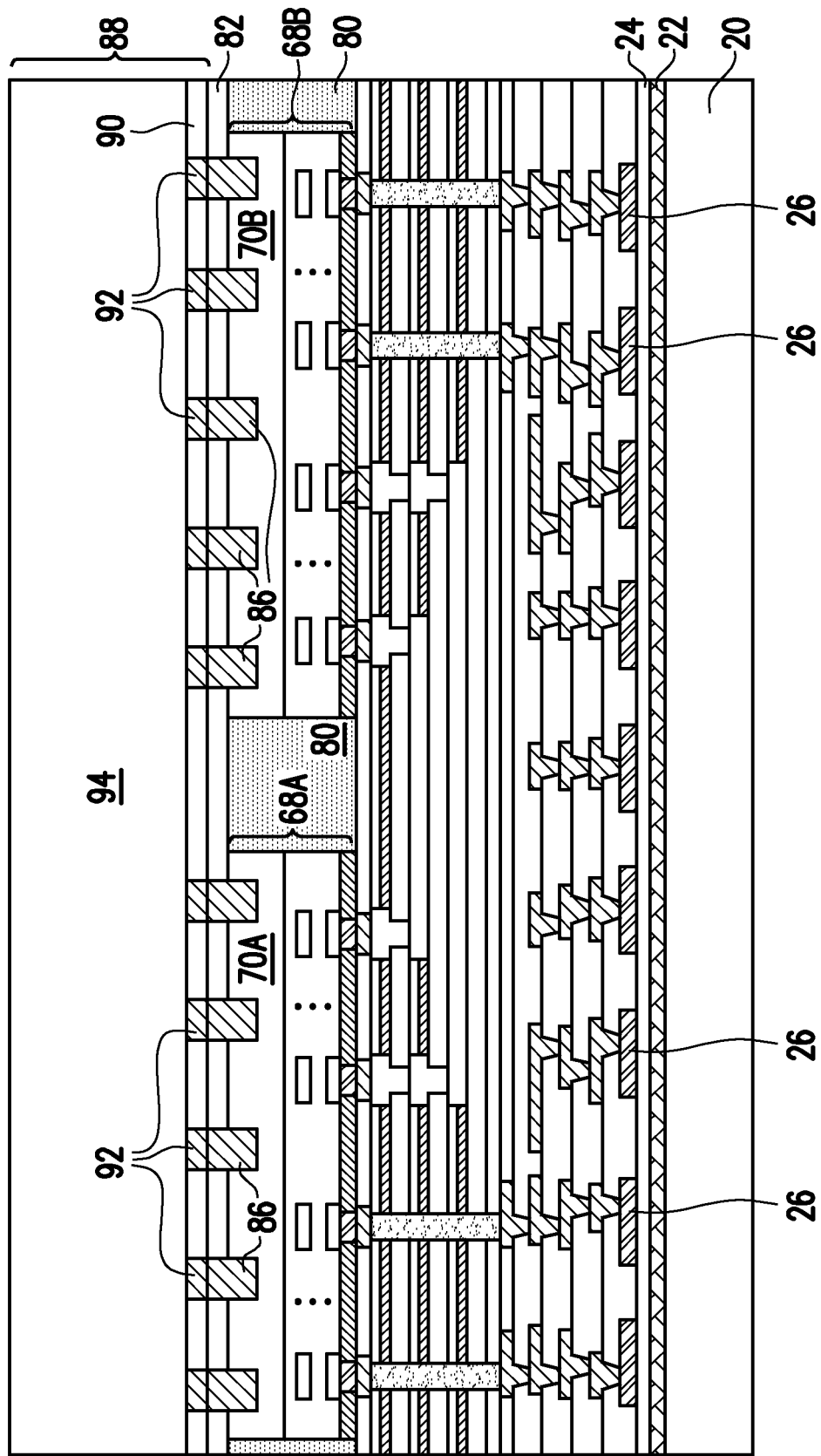

Next, as shown in FIG. 18A, wafer 88 is bonded to device dies 68A and 68B. The respective step is illustrated as step 322 in the process flow 300 as shown in FIG. 25. Wafer 88 includes bulk substrate 94, which may be a silicon substrate or a metal substrate. The bulk substrate 94 is also a wafer extending on a plurality of device dies 68A and a plurality of device dies 68B placed over the same carrier 20. When formed of metal, substrate 94 may be formed of copper, aluminum, stainless steel, or the like. When substrate 94 is formed of silicon, there is no active device and passive device formed in wafer 88. Wafer 88 has two functions. First, wafer 88 provides mechanical support to the underlying structure since device dies 68A and 68B have been thinned in order to allow for better gap filling. Also, silicon or metal (of substrate 94) has high thermal conductivity, and hence wafer 88 may act as a heat spreader.

Dielectric layer 90 is formed at the surface of substrate 94. Dielectric layer 90 may be formed of silicon oxide, for example. Also, bond pads 92 are formed in dielectric layer 90, and the illustrated bottom surfaces of bond pads 92 are coplanar with the illustrated bottom surface of dielectric layer 90. The pattern and the horizontal sizes of bond pads 92 may be the same as or similar to that of the respective bond pads 86.

The bonding of wafer 88 onto device dies 68A and 68B is through hybrid bonding. For example, dielectric layers 82 and 90 are bonded to each other, and may form Si—O—Si bonds. Bond pads 92 are bonded to the respective bond pads 86 through metal-to-metal direct bonding.

Advantageously, bond pads 86, by contacting (and even inserted into) substrates 70A and 70B, provide a good thermal dissipating path, so that the heat generated in device dies 68A and 68B can easily dissipate into bulk substrate 94.

Figure 18B:
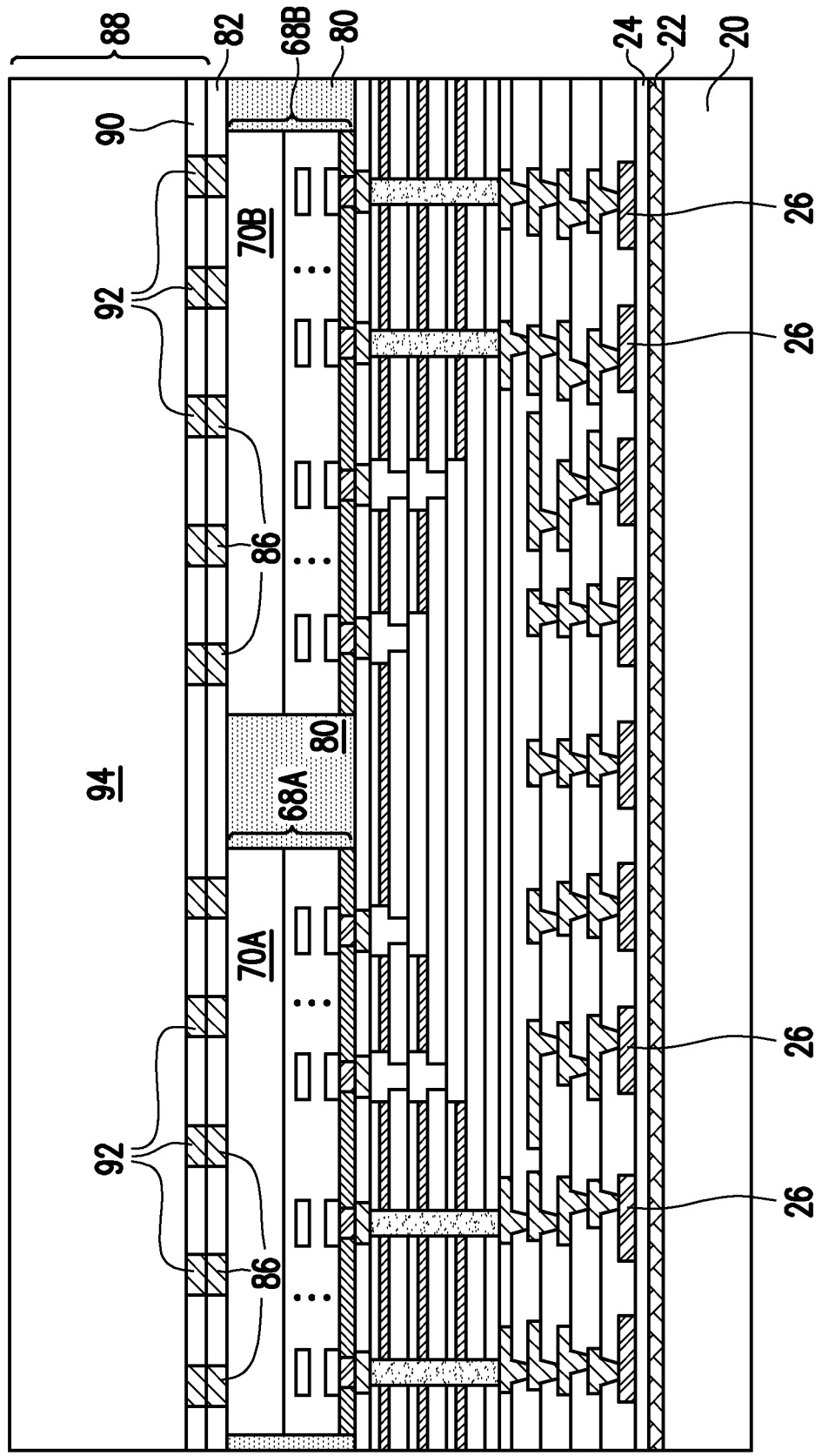

FIG. 18B illustrates the package formed in accordance with some embodiments of the present disclosure. These embodiments are similar to the embodiments shown in FIG. 18A, except that bond pads 86 penetrate through dielectric layer 82 and does not extend into substrates 70A and 70B. Bond pads 86 are in contact with substrates 70A and 70B in accordance with some embodiments. In accordance with alternative embodiments, one or both of bond pads 86 and 92, instead of penetrating through the respective dielectric layers 82 and 90, extend partially into the respective dielectric layers 82 and 90 from the interface where the bonding occurs. Bond pads 86 and 92 and bulk substrate 94 may be electrically grounded in accordance with some embodiments of the present disclosure to provide electrical grounding for substrates 70A and 70B.

Figure 18C:
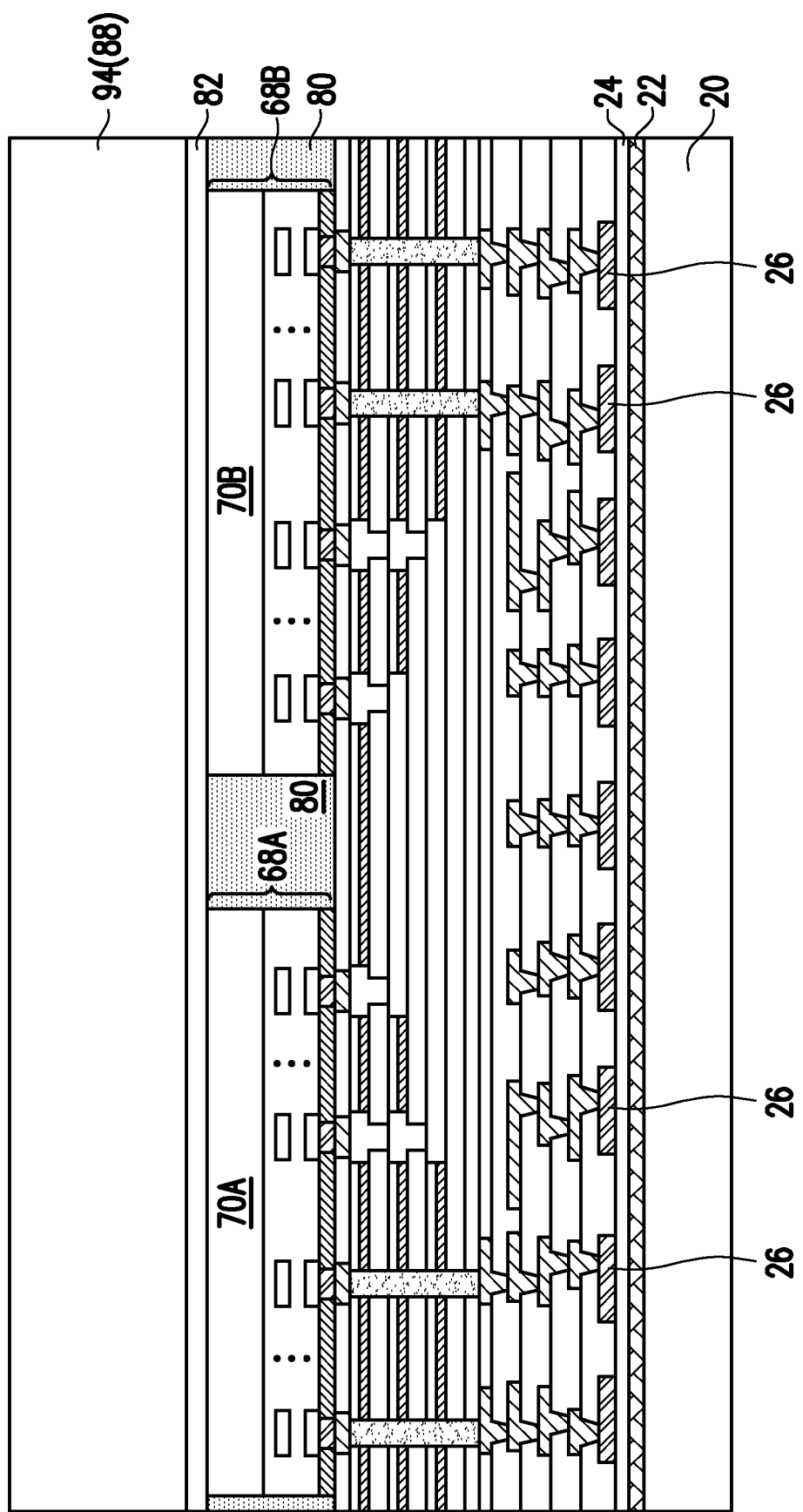

FIG. 18C illustrates the package formed in accordance with some embodiments of the present disclosure. These embodiments are similar to the embodiments shown in FIGS. 18A and 18B, except that bond pads 86 and 92 and dielectric layer 90 (as in FIGS. 18A and 18B) are not formed. Bulk substrate 94, which is also wafer 88, and is a silicon wafer, is bonded to dielectric layer 82 through fusion bonding.

In accordance with alternative embodiments of the present disclosure, wafer 88 is a metal wafer. Accordingly, layer 82 in FIG. 18C may be a Thermal Interface Material (TIM), which is an adhesive layer having a high thermal conductivity.

Figure 19:
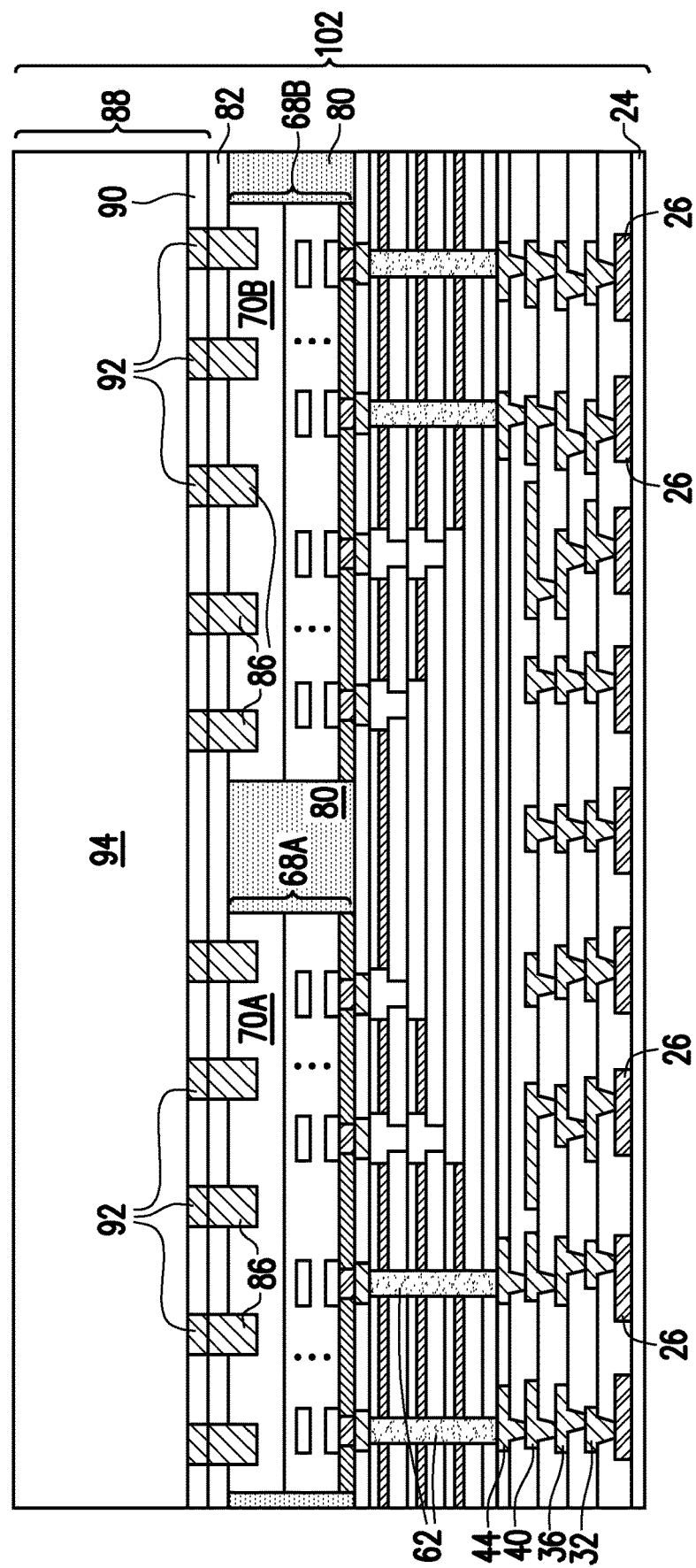

Next, the structure formed on carrier 20 is de-bonded from carrier 20, for example, by projecting light such as UV light or laser on release layer 22 to decompose release layer 22, and carrier 20 and release layer 22 are removed from the overlying structure, which is referred to as composite wafer 102 (FIG. 19).

Figure 20:
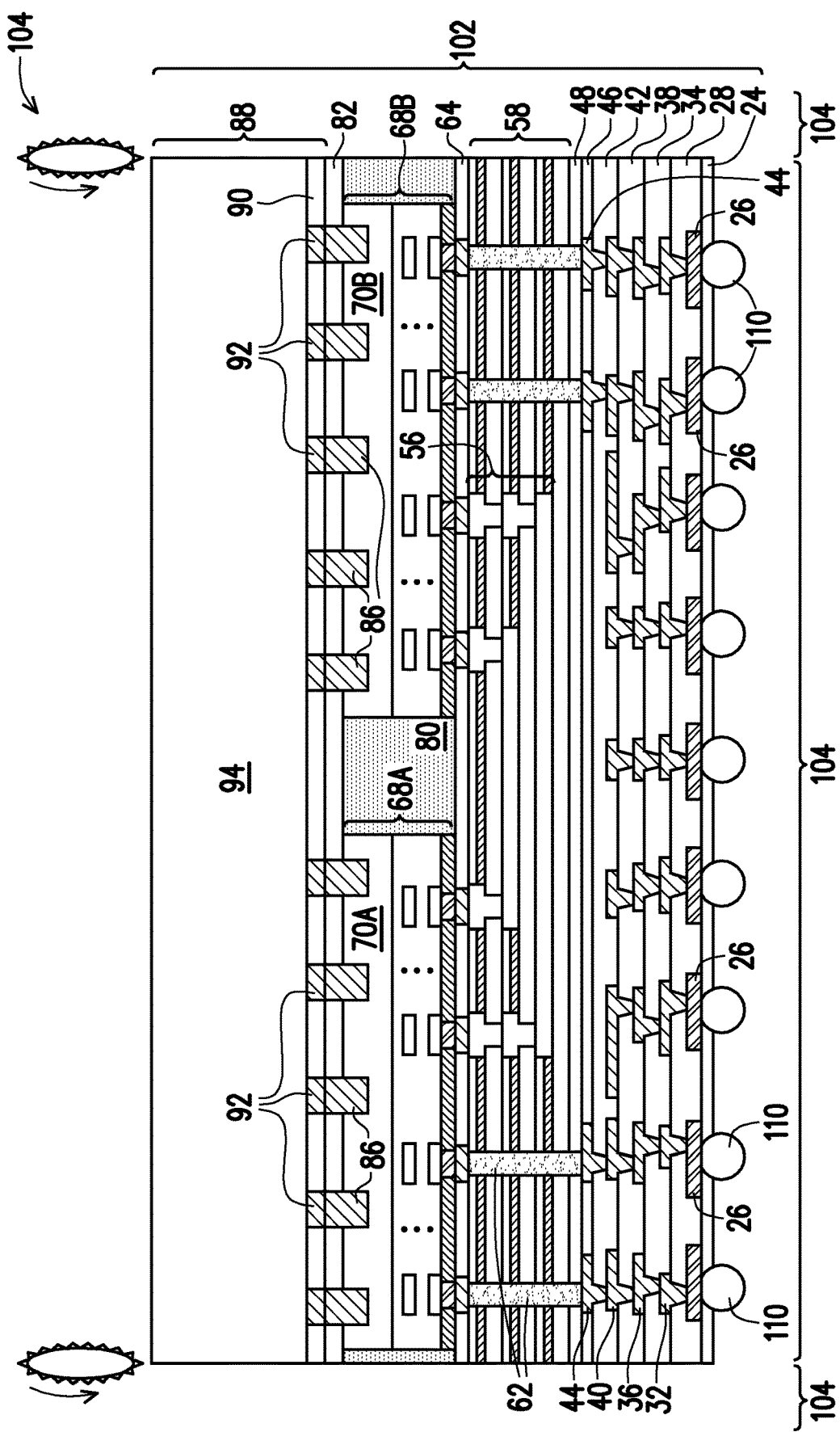

FIG. 20 illustrates the formation of electrical connectors 110, which may penetrate through dielectric layer 24, and connect to RDLs 26. Electrical connectors 110 may be metal bumps, solder bumps, metal pillars, wire bonds, or other applicable connectors. A die-saw step is performed on composite wafer 102 to separate composite wafer 102 into a plurality of packages 104. The respective step is illustrated as step 324 in the process flow 300 as shown in FIG. 25. Packages 104 are identical to each other, and each of packages 104 includes both device dies 68A and 68B.

Figure 21:
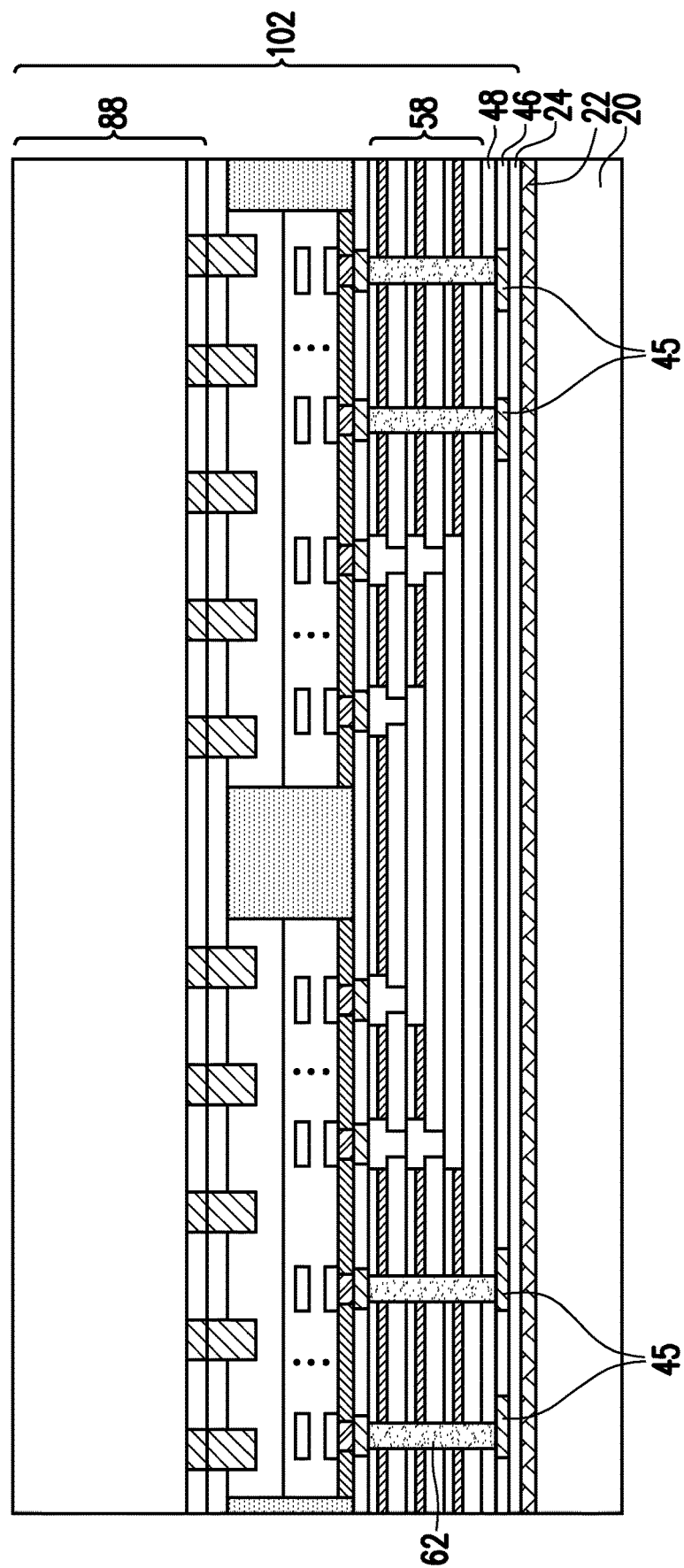
FIGS. 21 and 22 illustrate the cross-sectional views of intermediate stages in the formation of Si-less packages in accordance with some embodiments.
Figure 22:
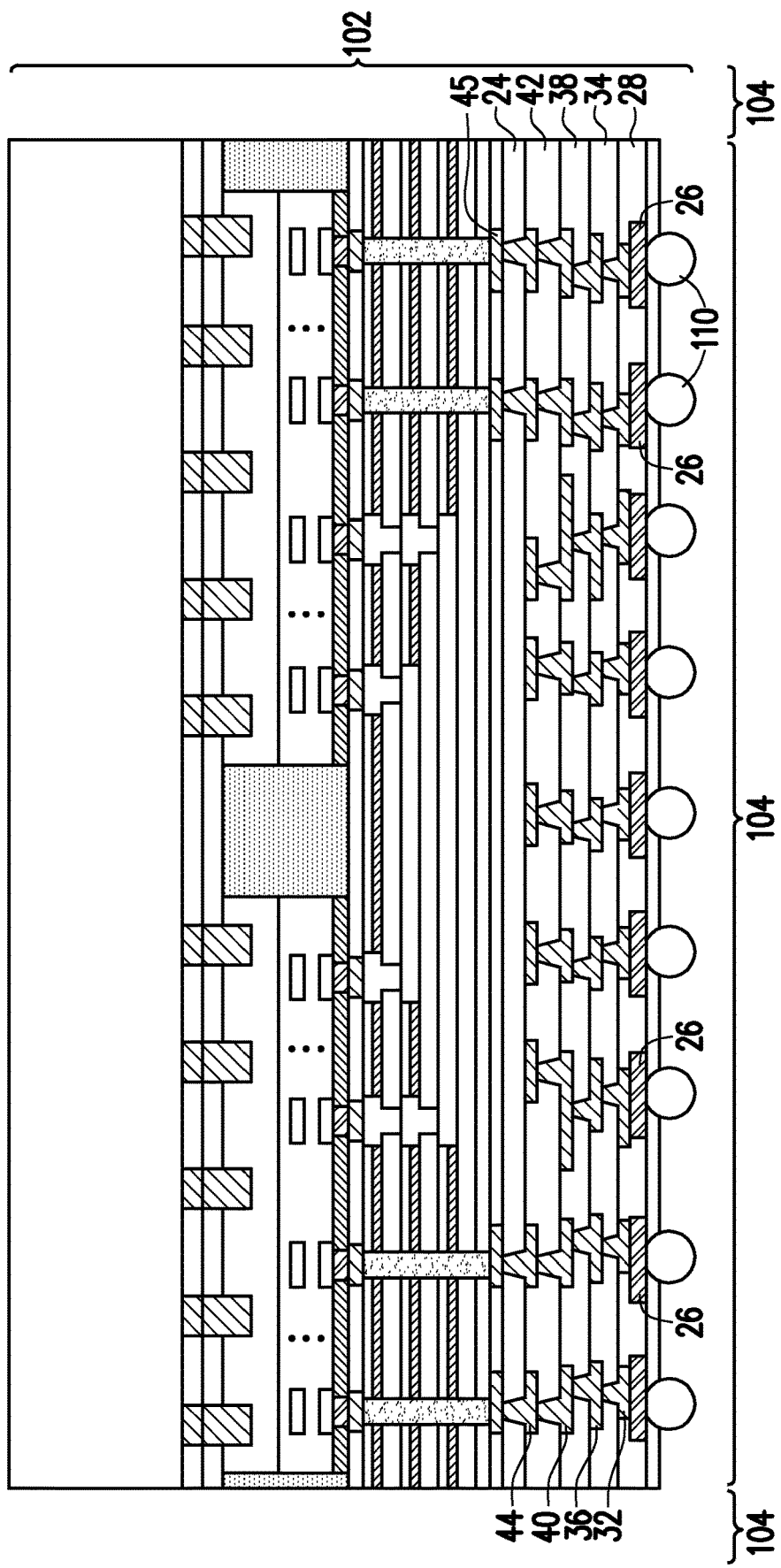

FIGS. 21 and 22 illustrate the cross-sectional views of intermediate stages in the formation of a package in accordance with some embodiments of the present disclosure. Unless specified otherwise, the materials and the formation methods of the components in these embodiments are essentially the same as the like components, which are denoted by like reference numerals in the embodiments shown in FIGS. 1 through 20. The details regarding the formation process and the materials of the components shown in FIGS. 21 and 22 may thus be found in the discussion of the embodiment shown in FIGS. 1 through 20. FIG. 21 illustrates a cross-sectional view of composite wafer 102, which is essentially the same as what is shown in FIG. 20, except metal pads 45 are formed on dielectric layer 24, while the features including dielectric layers 28, 34, 38, and 42 and RDLs 32, 36, 40 and 44 as shown in FIG. 20 are not formed on carrier 20. Rather, as shown in FIG. 22, which illustrates a structure after the step shown in FIG. 21, the dielectric layers 28, 34, 38, and 42 and RDLs 32, 36, 40 and 44 are formed after carrier 20 (FIG. 21) is detached. The sequence for forming dielectric layers 28, 34, 38, and 42 in accordance with these embodiments are reversed relative to the sequence shown in FIGS. 1 through 11. It is noted that due to different formation sequences, the orientations of RDLs 32, 36, 40 and 44 are inverted (in the vertical direction) compared to what is shown in FIG. 20. Packages 104 are then formed through the die-saw of composite wafer 102.

Figure 23:
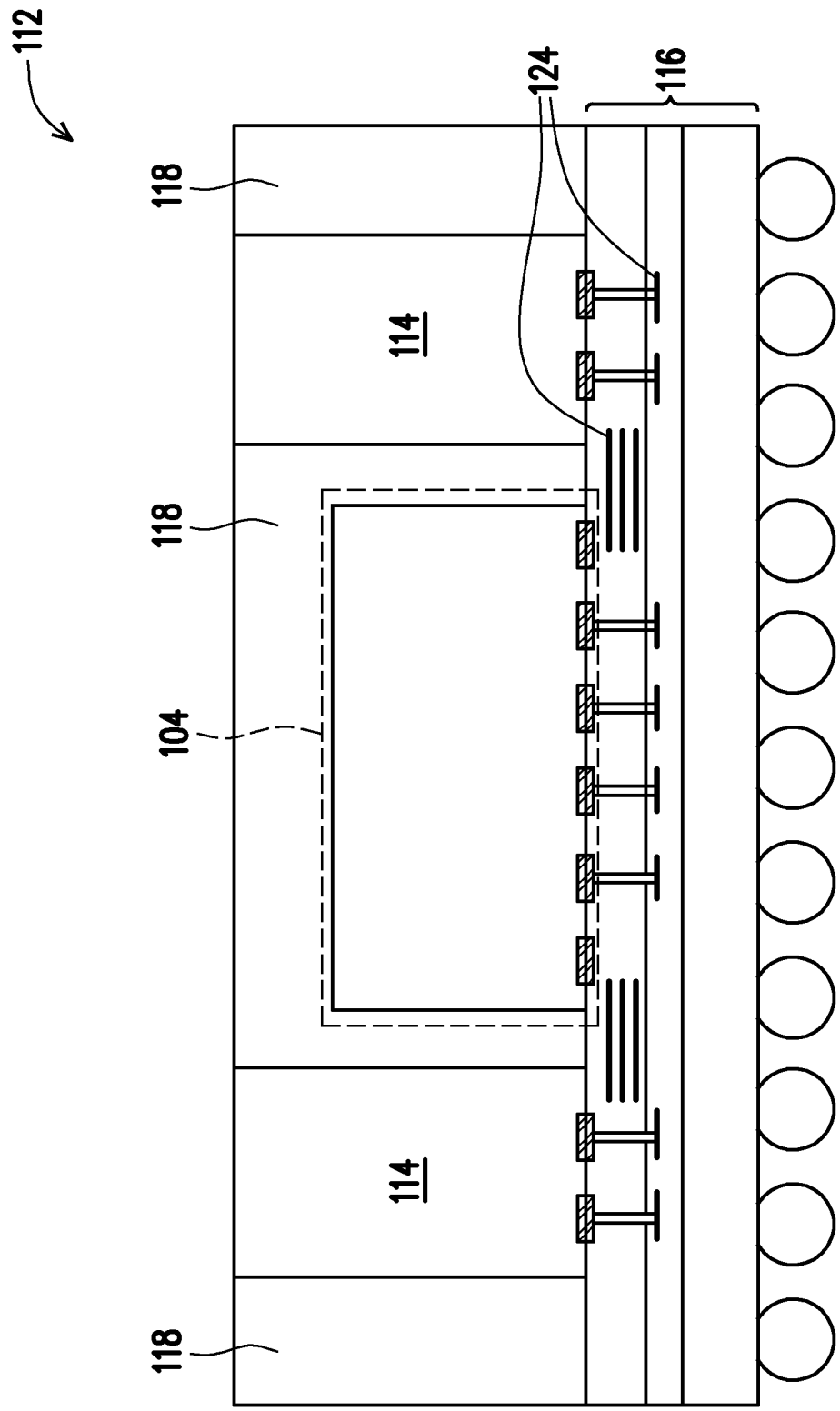
FIGS. 23 and 24 illustrate the cross-sectional views of some packages including the Si-less packages in accordance with some embodiments.

FIG. 23 illustrates a package 112 in which package 104 (FIGS. 20 and 22) is embedded. The package includes memory cubes 114, which includes a plurality of stacked memory dies (not shown separately). Package 104 and memory cubes 114 are encapsulated in encapsulating material 118, which may be a molding compound. Dielectric layers and RDLs (collectively illustrated as 116) are underlying and connected to package 104 and memory cubes 114. In accordance with some embodiments, dielectric layers and RDLs 116 are formed using similar materials and have similar structures as that are shown in FIGS. 1 through 11.

Figure 24:
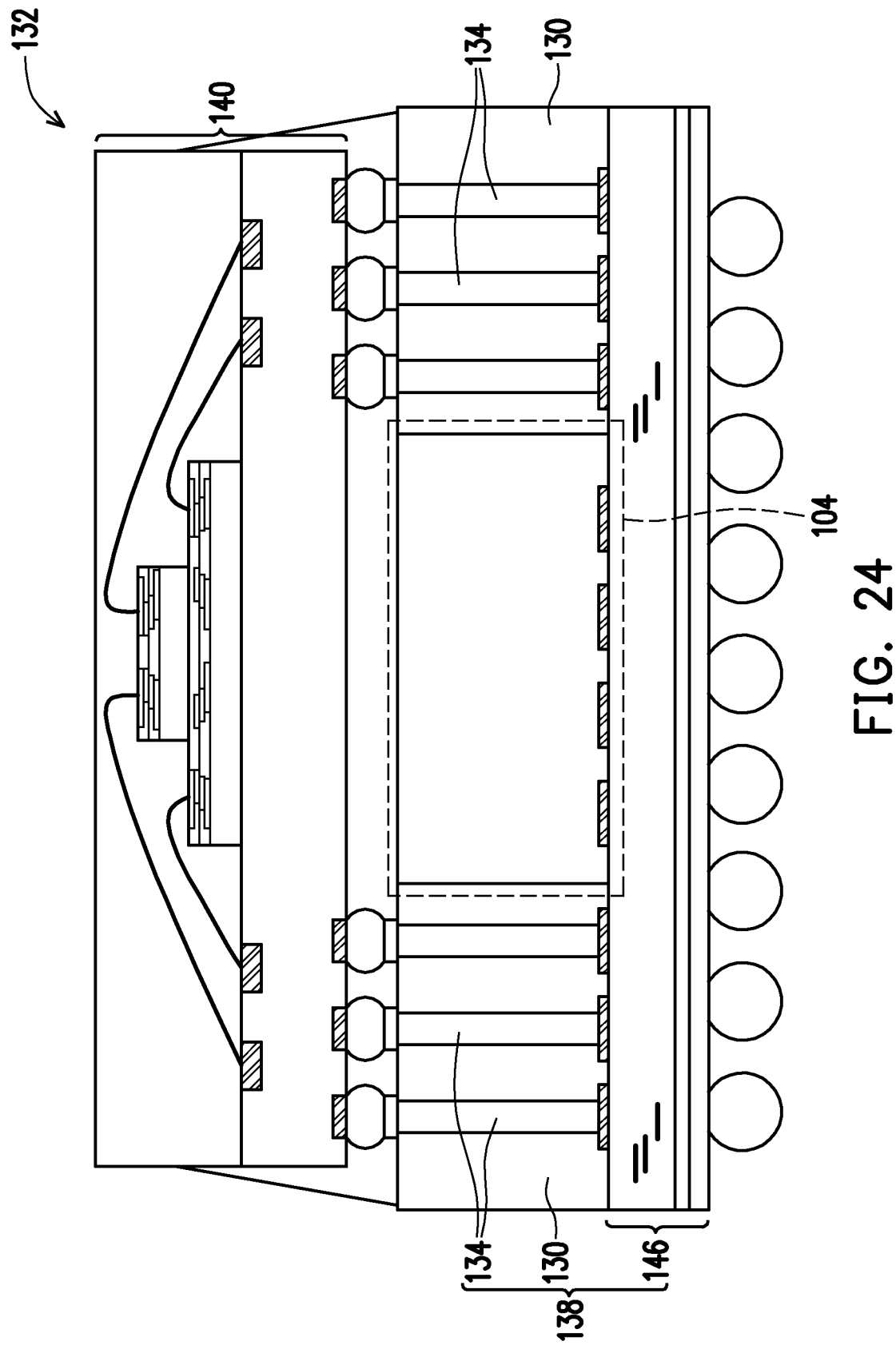

FIG. 24 illustrates Package-on-Package (PoP) structure 132, which has Integrated Fan-Out (InFO) package 138 bonded with top package 140. InFO package 138 also includes package 104 embedded therein. Package 104 and through-vias 134 are encapsulated in encapsulating material 130, which may be a molding compound. Package 104 is bonded to dielectric layers and RDLs, which are collectively referred to as 146. Dielectric layers and RDLs 146 may also be formed using similar materials and have similar structures as what are shown in FIGS. 1 through 11.

The embodiments of the present disclosure have some advantageous features. By forming the fine-pitch RDLs for interposers using the processes typically used on silicon wafers (such as damascene processes), the fine-pitch RDLs may be formed to be thin enough to provide the capability for the communication of two or more device dies, all through the fine-pitch RDLs. No silicon substrate is used in the interposer, and hence the degradation in electrical performance resulted from the silicon substrate is avoided. There are also some heat-dissipating mechanisms built in the package for better heat dissipation.

In accordance with some embodiments of the present disclosure, a method includes forming a plurality of dielectric layers, forming a plurality of redistribution lines in the plurality of dielectric layers, etching the plurality of dielectric layers to form an opening, filling the opening to form a through-dielectric via penetrating through the plurality of dielectric layers, forming an insulation layer over the through-dielectric via and the plurality of dielectric layers, forming a plurality of bond pads in the insulation layer, and bonding a device to the insulation layer and a portion of the plurality of bond pads through hybrid bonding.

In accordance with some embodiments of the present disclosure, a method includes forming a plurality of dielectric layers, forming a plurality of redistribution lines in the plurality of dielectric layers, forming a first through-dielectric via and a second through-dielectric via penetrating through the plurality of dielectric layers, forming an insulation layer over the plurality of dielectric layers, forming a plurality of bond pads in the insulation layer and electrically coupling to the first and the second through-dielectric vias and the plurality of redistribution lines, and bonding a first device and a second device to the dielectric layer and the plurality of bond pads through hybrid bonding. The first device and the second device are electrically interconnected through the plurality of redistribution lines.

In accordance with some embodiments of the present disclosure, a package includes a plurality of dielectric layers, a plurality of redistribution lines in each of the plurality of dielectric layers, a through-dielectric via penetrating through the plurality of dielectric layers, a plurality of bond pads over and connected to the through-dielectric via and the plurality of redistribution lines, and an insulation layer, with the plurality of bond pads located in the insulation layer. A device is bonded to the insulation layer and a portion of the plurality of bond pads through hybrid bonding.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a redistribution structure comprising:
  a first plurality of dielectric layers;
  a plurality of redistribution lines extending into the first plurality of dielectric layers, wherein each of the plurality of redistribution lines comprises a metal trace and a metal via over and continuously joined to the metal trace, and wherein the metal via has upper portions narrower than respective lower portions;
  a second plurality of dielectric layers over the first plurality of dielectric layers; and
  a plurality of metal lines and plurality of metal vias, wherein each of the plurality of metal lines and a corresponding underlying one of the plurality of metal vias are in a same dielectric layer of the second plurality of dielectric layers, and wherein top surfaces of the plurality of metal lines are coplanar with top surfaces of the respective ones of the second plurality of dielectric layers; and
a first device die over and bonded to the redistribution structure.

2. The package of claim 1 further comprising solder regions under and electrically coupling to the plurality of redistribution lines, wherein no semiconductor substrate is located between the solder regions and a top dielectric layer in the second plurality of dielectric layers.

3. The package of claim 1, wherein top surfaces of the plurality of redistribution lines are in contact with bottom surfaces of respective ones of the first plurality of dielectric layers.

4. The package of claim 1, wherein the first plurality of dielectric layers comprise polymers, and the second plurality of dielectric layers comprise inorganic dielectric materials.

5. The package of claim 1, wherein the plurality of metal lines and the plurality of vias form dual damascene structures.

6. The package of claim 1, wherein the metal trace and the via have not distinguishable interface in between.

7. The package of claim 1, further comprising a through-via penetrating through the second plurality of dielectric layers, wherein the through-via electrically connects one of the plurality of redistribution lines to the first device die.

8. The package of claim 7, wherein the through-via comprises a substantially straight edge extending from a top surface of a top dielectric layer of the second plurality of dielectric layers to a bottom surface of a bottom dielectric layer of the second plurality of dielectric layers.

9. The package of claim 1 further comprising:
a second device die over and bonded to the redistribution structure, wherein the first device die and the second device die are electrically interconnected through some of the plurality of metal lines and the plurality of metal vias.

10. The package of claim 1 further comprising:
a bond pad physically contacting a semiconductor substrate of the first device die, wherein the bond pad is signally disconnected from all devices in the first device die.

11. The package of claim 10, wherein the bond pad further extends into the semiconductor substrate of the first device die.

12. The package of claim 1 further comprising a silicon substrate over and attached to the first device die, wherein the silicon substrate is free from active devices and passive devices thereon.

13. A package comprising:
a plurality of dielectric layers;
a plurality of metal lines and vias in the plurality of dielectric layers, wherein the plurality of metal lines and vias form damascene structures;
a dielectric layer underlying the plurality of dielectric layers;
a redistribution line comprising a trace portion and a via portion, wherein the trace portion has a top surface physically contacting a bottom surface of the dielectric layer, and a first bottom surface lower than an entirety of the dielectric layer;
a solder region underlying the redistribution line; and
a device die over the plurality of dielectric layers, wherein the device die is electrically connected to the solder region through the redistribution line, and wherein the device die comprises:
  a semiconductor substrate comprising a first edge and a second edge opposing to each other, wherein the plurality of dielectric layers extend laterally beyond the first edge and the second edge; and
  an interconnect structure between the semiconductor substrate and the plurality of dielectric layers, wherein the interconnect structure comprises a third edge and a fourth edge flush with the first edge and the second edge, respectively.

14. The package of claim 13, wherein in each of the damascene structures, a corresponding via and a corresponding metal line in the plurality of metal lines and vias are continuously connected, with the corresponding metal line being over the corresponding via.

15. The package of claim 13, wherein the via portion of the redistribution line is tapered, with upper portions of the via portion being narrower than respective lower portions of the via portion.

16. The package of claim 13, wherein no semiconductor substrate is located between the solder region and the device die.

17. The package of claim 13, wherein the dielectric layer comprises a polymer, and the plurality of dielectric layers comprise low-k inorganic dielectric materials.

18. The package of claim 13 further comprising dielectric gap-filling regions on opposing sides of the device die, wherein the dielectric gap-filling regions contact the first edge, the second edge, the third edge, and the fourth edge to form vertical interfaces.

19. A package comprising:
a plurality of dielectric layers;
a plurality of dual damascene structures in the plurality of dielectric layers, wherein each of the damascene structures comprises a via and a metal line over and joined to the via, and wherein the metal lines in the damascene structures have first top surfaces coplanar with second top surfaces of respective layers in the plurality of dielectric layers;
a plurality of through-dielectric vias penetrating through all of the plurality of dielectric layers;
a device die overlapping and electrically coupling to one of the plurality of dual damascene structures and one of the plurality of through-dielectric vias;
a polymer layer underlying the plurality of dielectric layers; and
a redistribution line extending into the polymer layer, wherein the redistribution line comprises an additional via, and the additional via has upper portions narrower than respective lower portions.

20. The package of claim 19 further comprising a solder region underlying and electrically connected to the device die through the redistribution line and one of the plurality of through-dielectric vias, wherein the package is free from any semiconductor substrate between the solder region and the device die.

* * * * *